United States Patent
Endo et al.

(10) Patent No.: US 9,595,631 B2
(45) Date of Patent: Mar. 14, 2017

(54) SEMICONDUCTOR LIGHT EMITTING DEVICE AND METHOD OF MANUFACTURING THE SAME

(71) Applicant: Kabushiki Kaisha Toshiba, Minato-ku (JP)

(72) Inventors: Mitsuyoshi Endo, Yamato (JP); Shuji Itonaga, Yokohama (JP); Miyuki Shimojuku, Kawasaki (JP); Yukihiro Nomura, Fuchu (JP); Hideto Furuyama, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/825,340

(22) Filed: Aug. 13, 2015

(65) Prior Publication Data

US 2016/0268471 A1   Sep. 15, 2016

(30) Foreign Application Priority Data

Mar. 12, 2015 (JP) ................. 2015-049575

(51) Int. Cl.
   *H01L 33/00* (2010.01)
   *H01L 29/22* (2006.01)
   (Continued)

(52) U.S. Cl.
   CPC ........ *H01L 33/0008* (2013.01); *H01L 33/005* (2013.01); *H01L 33/42* (2013.01);
   (Continued)

(58) Field of Classification Search
   CPC ......... H01L 33/08; H01L 33/20; H01L 33/24; H01L 33/387; H01L 33/382; H01L 33/385;
   (Continued)

(56) References Cited

U.S. PATENT DOCUMENTS

2006/0214173 A1   9/2006   Beeson et al.
2011/0049545 A1   3/2011   Basin et al.
2013/0285091 A1*  10/2013  Akimoto ............... H01L 33/44
                                                       257/98

FOREIGN PATENT DOCUMENTS

EP   2 650 932 A1   10/2013
EP   2 657 995 A2   10/2013
(Continued)

OTHER PUBLICATIONS

Extended European Search Report issued on Feb. 4, 2016 in European Patent Application No. 15181558.6.
(Continued)

*Primary Examiner* — Hsien Ming Lee
(74) *Attorney, Agent, or Firm* — Oblon, McClelland, Maier & Neustadt, L.L.P.

(57) ABSTRACT

According to one embodiment, a semiconductor light-emitting device includes a semiconductor layer having a first layer including an n-type semiconductor, a second layer including a p-type semiconductor, a light emitting layer, a first surface, and a second surface opposite to the first surface; an n-side electrode; a p-side electrode; a third layer; an insulating member; an n-side metal portion; and a p-side metal portion. The insulating member has a lower surface. A height of the lower surface is higher than a height of the first surface. The insulating member covers a periphery of the third layer, and has light reflectivity on at least a surface of a part adjacent to a side surface of the third layer.

18 Claims, 35 Drawing Sheets

(51) Int. Cl.
    *H01L 27/14*   (2006.01)
    *H01L 21/00*   (2006.01)
    *H01L 33/44*   (2010.01)
    *H01L 33/46*   (2010.01)
    *H01L 33/56*   (2010.01)
    *H01L 33/42*   (2010.01)
    *H01L 33/60*   (2010.01)

(52) U.S. Cl.
    CPC ............... *H01L 33/44* (2013.01); *H01L 33/46* (2013.01); *H01L 33/56* (2013.01); *H01L 33/60* (2013.01); *H01L 2933/0016* (2013.01); *H01L 2933/0025* (2013.01); *H01L 2933/0033* (2013.01); *H01L 2933/0066* (2013.01)

(58) Field of Classification Search
    CPC ................. H01L 33/505; H01L 33/507; H01L 2933/0033; H01L 2224/16145; H01L 25/167; H01L 33/48
    USPC ......... 257/13, 79–82, 88, 99, 414, 431, 432, 257/433; 438/27–29, 33–35, 48
    See application file for complete search history.

(56) References Cited

FOREIGN PATENT DOCUMENTS

| | | |
|---|---|---|
| EP | 2 657 995 A3 | 10/2013 |
| JP | 2010-251807 A | 11/2010 |
| JP | 2012-79776 | 4/2012 |
| JP | 2012-256678 | 12/2012 |
| TW | 201349596 A | 12/2013 |
| TW | 201434182 A | 9/2014 |

OTHER PUBLICATIONS

Combined Taiwanese Office Action and Search Report issued on Jun. 8, 2016 in Patent Application No. 104125626 (with English language translation).

Taiwanese Office Action issued Sep. 26, 2016, in Patent Application No. 104125626 (with English translation).

* cited by examiner

SEMICONDUCTOR LIGHT EMITTING DEVICE AND METHOD OF
MANUFACTURING THE SAME

CROSS-REFERENCE TO RELATED APPLICATION

This application is based upon and claims the benefit of priority from Japanese Patent Application No. 2015-049575, filed on Mar. 12, 2015; the entire contents of which are incorporated herein by reference.

FIELD

Embodiments described herein relate generally to a semiconductor light emitting device and a method for manufacturing same.

BACKGROUND

There has been proposed a semiconductor light emitting device having a chip-size package structure in which a phosphor layer is provided on one side of a semiconductor layer including a light emitting layer, and a interconnect layer, external terminals, and a resin layer are provided on the other side thereof.

In a manufacturing process of the chip-size package structure, stress concentration on the semiconductor layer can be a problem.

DETAILED DESCRIPTION

Figure 1:
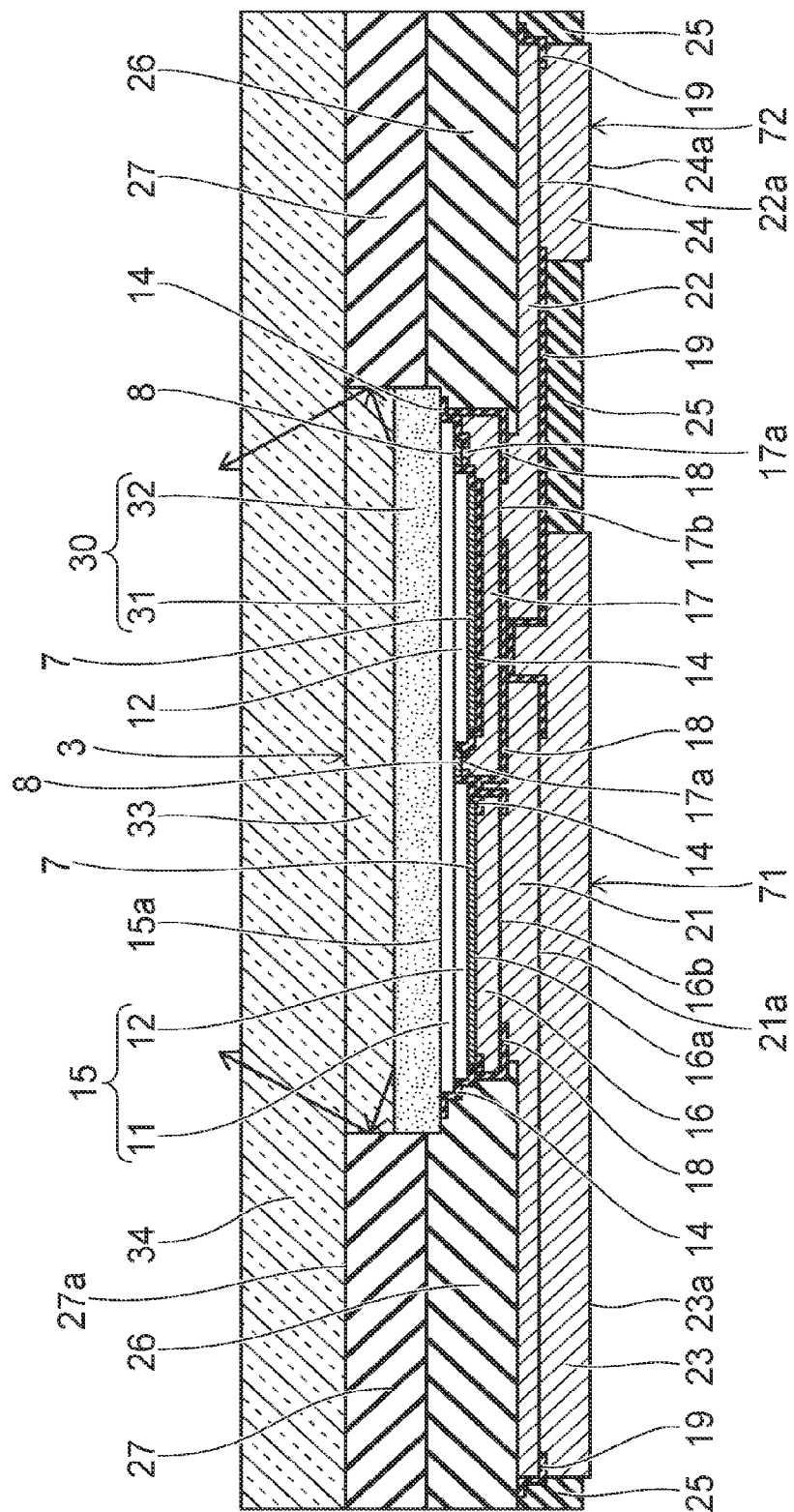
FIG. 1 is a schematic cross-sectional view of a semiconductor light emitting device of an embodiment.

According to one embodiment, a semiconductor light-emitting device includes a semiconductor layer having a first layer including an n-type semiconductor, a second layer including a p-type semiconductor, a light emitting layer, a first surface, and a second surface opposite to the first surface; an n-side electrode; a p-side electrode; a third layer; an insulating member; an n-side metal portion; and a p-side metal portion. The insulating member has a lower surface. A height of the lower surface is higher than a height of the first surface. The insulating member covers a periphery of the third layer, and has light reflectivity on at least a surface of a part adjacent to a side surface of the third layer.

Embodiments are described below with reference to the drawings. Note that in the drawings, the same components are denoted by the same reference numerals and signs.

FIG. 1 is a schematic cross-sectional view of a semiconductor light emitting device according to an embodiment of the invention.

Figure 2:
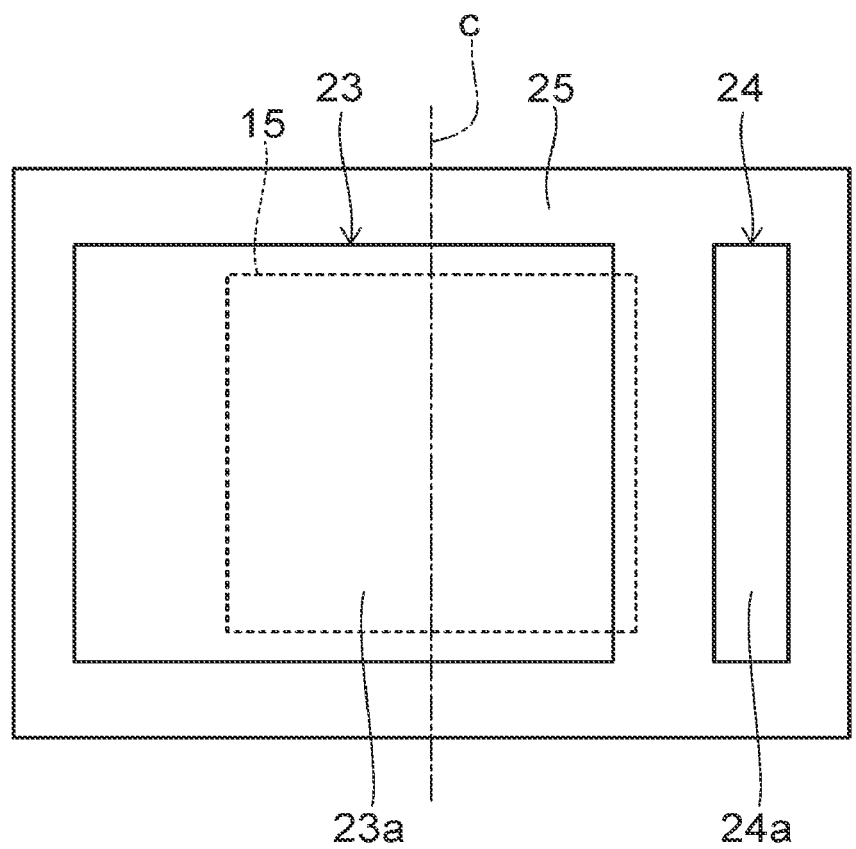
FIG. 2 is a schematic plan view of the semiconductor light emitting device of the embodiment.

FIG. 2 is a schematic plan view of a mounting surface of the semiconductor light emitting device according to the embodiment, and corresponds to a bottom view of FIG. 1.

The semiconductor light emitting device according to the embodiment includes a chip-size device (hereinafter simply referred to as a chip) 3 formed as a wafer, an insulating member 27 provided on the periphery of the chip 3, and metal layers 71, 72 provided on the mounting surface side.

The chip 3 includes electrodes 7, 8, first interconnect layers 16, 17 (on-chip interconnect layers), optical layers (third layer) 30, 33, and a semiconductor layer 15. The semiconductor layer 15 is provided between the first interconnect layers 16,17 and the optical layers 30, 33.

Figure 3:
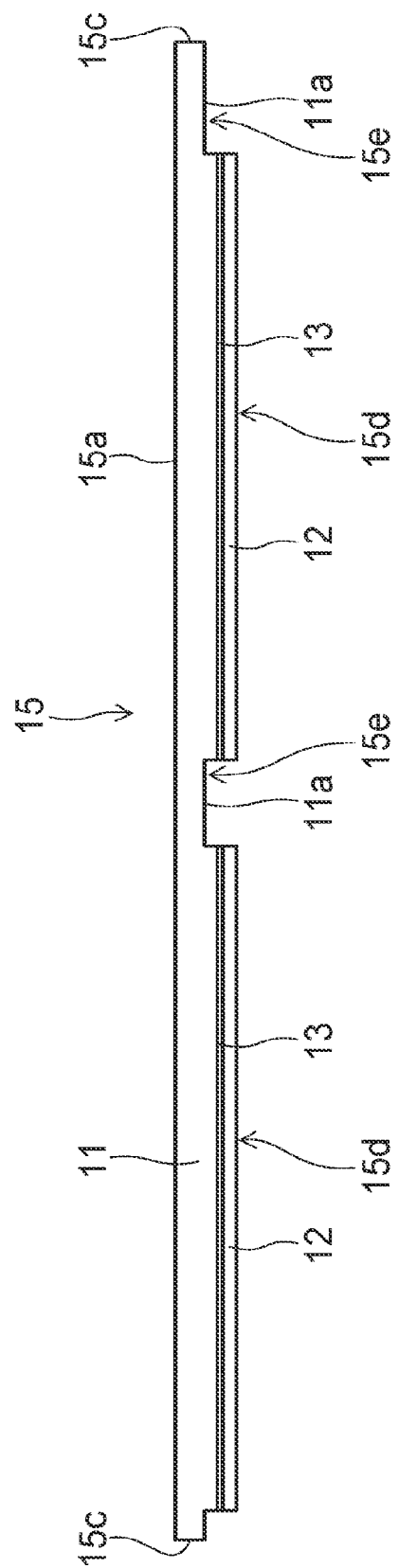
FIG. 3 is a schematic cross-sectional view of the semiconductor layer.

FIG. 3 is an enlarged schematic cross-sectional view of the semiconductor layer 15.

The semiconductor layer 15 includes, for example, gallium nitride. The semiconductor layer 15 has a first layer 11 including n-type semiconductor, a second layer 12 including a p-type semiconductor, and a light emitting layer 13. The light emitting layer 13 is provided between the first layer 11 and the second layers 12.

The first layer 11 includes, for example, a foundation buffer layer, and an n-type GaN layer. The second layer 12 includes, for example, a p-type GaN layer. The light emitting layer 13 includes a material for emitting blue light, violet light, bluish-violet light, ultraviolet light, or the like. The emission peak wavelength of the light emitting layer 13 is, for example, in a range of 430 through 470 nm.

Figure 4A:
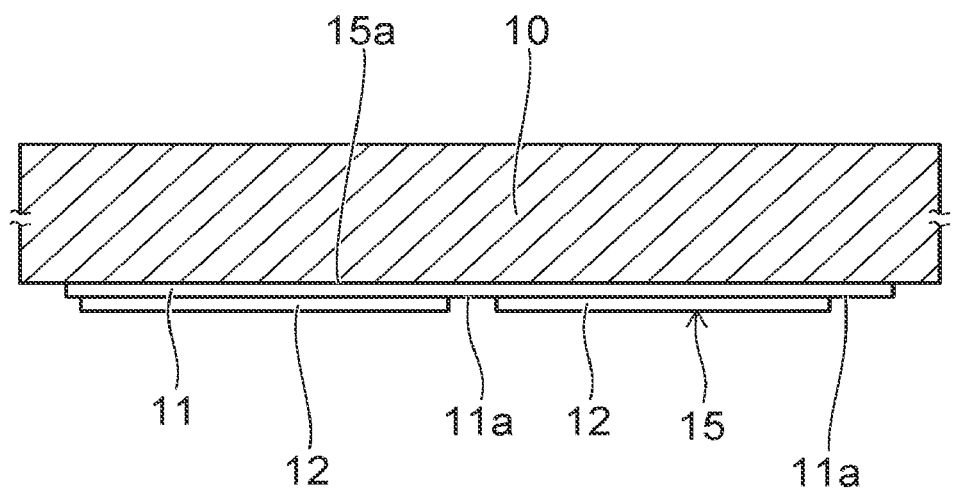
FIG. 4A to FIG. 17B are schematic views showing a method for manufacturing the semiconductor light emitting device of the embodiment.

As shown in FIG. 4A, the semiconductor layer 15 is epitaxially grown on the substrate 10. The substrate 10 is, for example, a silicon substrate, a sapphire substrate, or a silicon carbide substrate. The first layer 11, the light emitting layer 13, and the second layer 12 are epitaxially grown in sequence on the substrate 10 in this order. Subsequently, the second layer 12 and the light emitting layer 13 are selectively removed by a reactive ion etching (RIE) method using a mask not shown.

Therefore, the semiconductor layer 15 has a region (a light emitting region) 15d having a laminated film of the second layer 12 and the light emitting layer 13, and regions 15e each having a second surface 11a of the first layer 11 not covered with the light emitting layer 13 and the second layer 12.

Figure 4B:
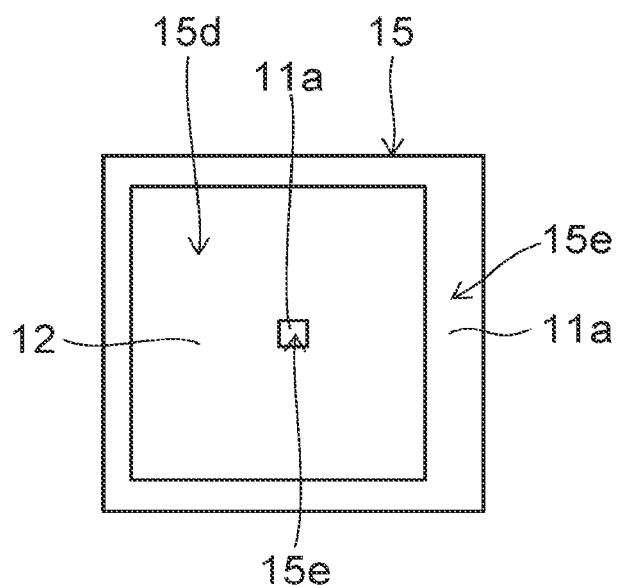

FIG. 4B corresponds to a bottom view of the semiconductor layer 15 shown in FIGS. 3 and 4A.

As shown in FIG. 4B, for example, the region 15e is formed to have an island shape surrounded by the light emitting region 15d, and the region 15e is formed on the outer circumferential side of the light emitting region 15d so as to continuously surrounding the light emitting region 15d. The area of the light emitting region 15d is larger than the area of the regions 15e.

As shown in FIG. 3, in the first layer 11, on the opposite side to the second surface 11a, there is formed a first surface 15a, which is not covered with the light emitting layer 13 and the second layer 12. Further, the semiconductor layer 15 has a side surface 15c continuous with the first surface 15a.

Figure 5A:
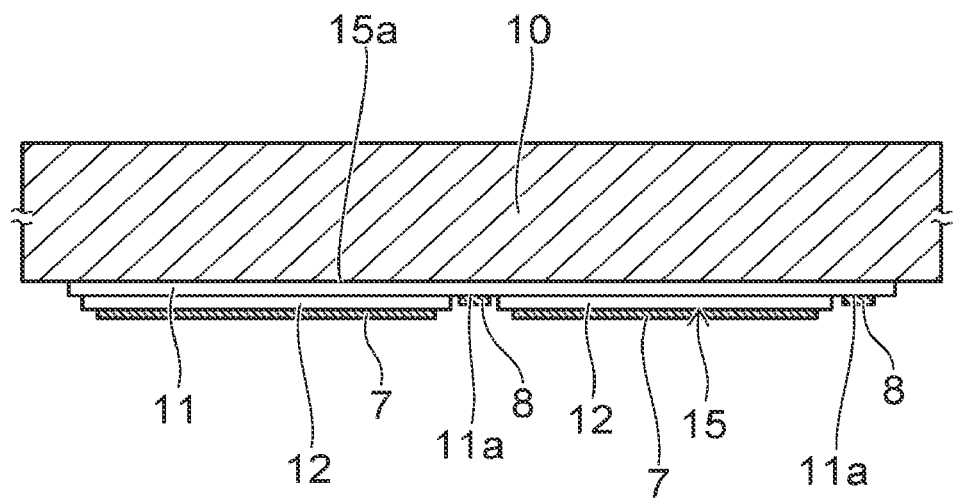
Figure 5B:
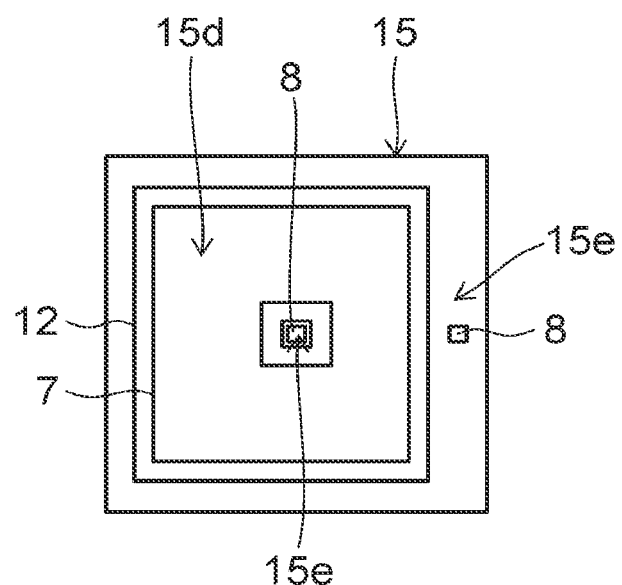

As shown in FIG. 5A and FIG. 5B corresponding to the bottom view of FIG. 5A, n-side electrodes 8 are provided on the second surface 11a of the first layer 11, and a p-side electrode 7 is provided on a surface of the second layer 12. The p-side electrode 7 is in contact with the first layer 11, and the n-side electrodes 8 are in contact with the second layer 12. The p-side electrode 7 and the n-side electrodes 8 are formed within a range of a region (a chip region) overlapping the semiconductor layer 15.

In the planar view of FIG. 5B, the area of the p-side electrode 7 is larger than the area of the n-side electrodes 8. The contact area between the p-side electrode 7 and the second layer 12 is larger than the contact area between the n-side electrodes 8 and the first layer 11.

Figure 6A:
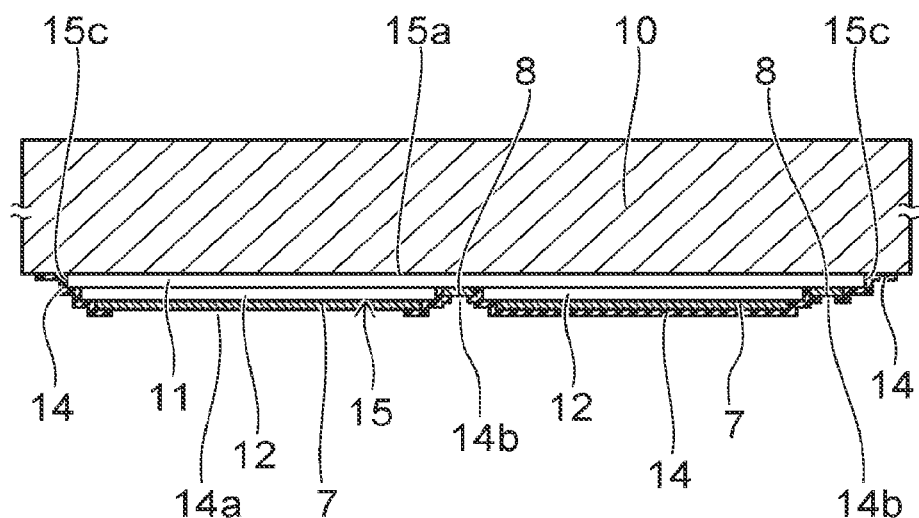
Figure 6B:
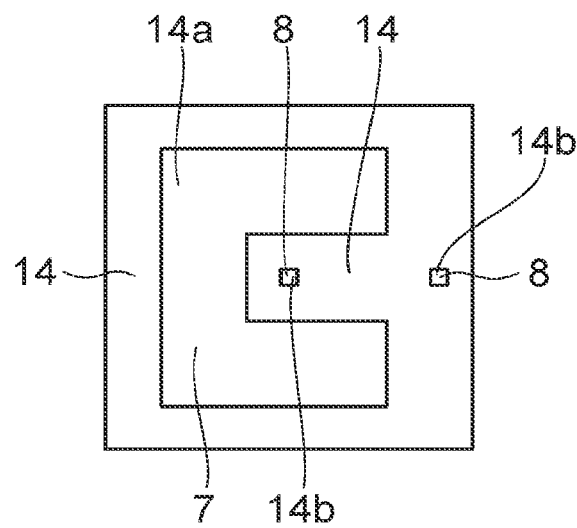

As shown in FIG. 6A and FIG. 6B corresponding to the bottom view of FIG. 6A, an insulating film 14 is provided on a surface of the semiconductor layer 15 other than the first surface 15a. The insulating film 14 is an inorganic film such as a silicon oxide film.

The insulating film 14 is provided with a first opening 14a for exposing the p-side electrode 7, and second openings 14b for respectively exposing the n-side electrodes 8. For example, there are formed the two second openings 14b on the n side so as to be separated from each other. The surface of the p-side electrode 7 between the two second openings 14b is covered with the insulating film 14.

The side surface 15c of the first layer 11, the side surface of the second layer 12, and the side surface of the light emitting layer 13 are covered with the insulating film 14.

Figure 7A:
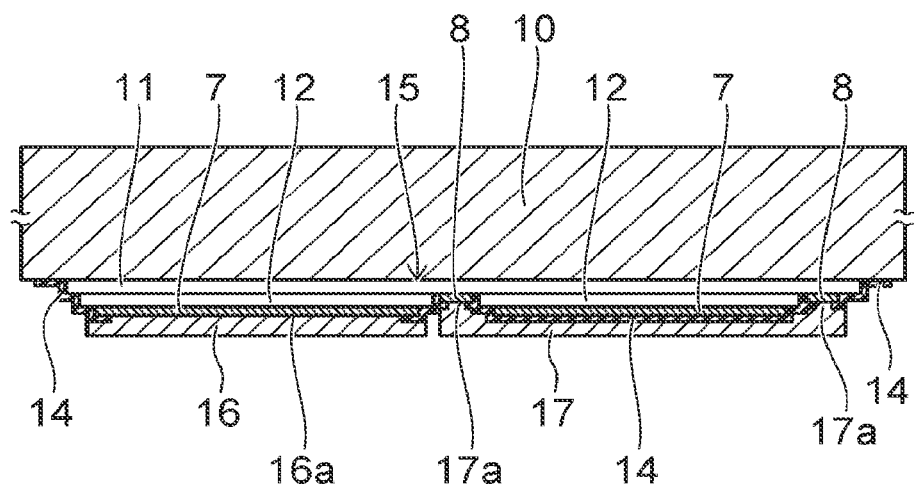
Figure 7B:
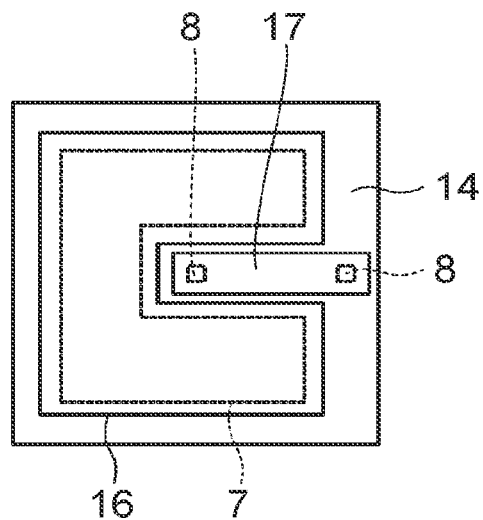

As shown in FIG. 7A and FIG. 7B corresponding to the bottom view of FIG. 7A, a first p-side interconnect layer 16 and a first n-side interconnect layer 17 are provided on the opposite side of the first surface 15a of the semiconductor layer 15.

The first p-side interconnect layer 16 is formed within a range of the region (the chip region) overlapping the semiconductor layer 15. The first p-side interconnect layer 16 is also provided in the first opening 14a, and has contact with the p-side electrode 7. The first p-side interconnect layer 16 is connected to the p-side electrode 7 via a contact section 16a formed integrally in the first opening 14a. The first p-side interconnect layer 16 is not in contact with the first layer 11.

The first n-side interconnect layer 17 is formed within a range of the region (the chip region) overlapping the semiconductor layer 15. The first n-side interconnect layer 17 is also provided in the second openings 14b, and has contact with the n-side electrodes 8. The first n-side interconnect layer 17 is connected to the n-side electrodes 8 via respective contact sections 17a formed integrally in the second openings 14b.

The first n-side interconnect layer 17 is formed to have, for example, a linear pattern shape extending in a direction connecting the two n-side electrodes 8 each having an island shape. The insulating film 14 is provided between a part of the first n-side interconnect layer 17 located between the two n-side electrodes 8 and the p-side electrode 7, and between a part of the first n-side interconnect layer 17 located between the two n-side electrodes 8 and the second layer 12, and thus, the first n-side interconnect layer 17 is not in contact with the p-side electrode 7 and the second layer 12.

As shown in FIG. 4B, the light emitting region 15d including the light-emitting layer 13 constitutes a large portion of a planar region of the semiconductor layer 15. Further, as shown in FIG. 5B, the area of the p-side electrode 7 connected to the light emitting region 15d is larger than the area of the n-side electrodes 8. Therefore, a large light emitting surface can be obtained, and thus, the light output can be made high.

Figure 25A:
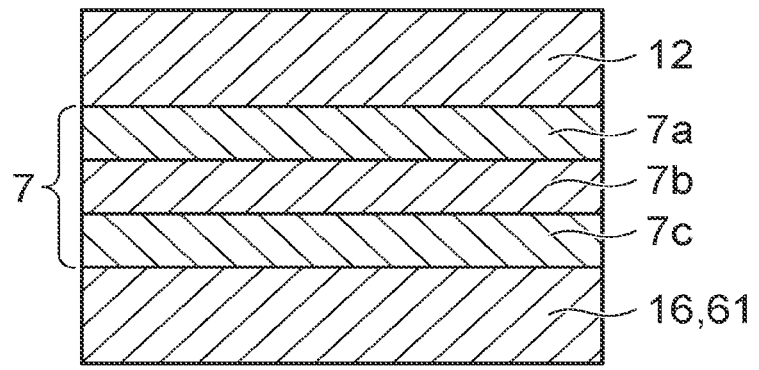
FIG. 25A and FIG. 25B are enlarged schematic cross-sectional views of a part of the semiconductor light emitting device of the embodiment.

The p-side electrode 7 is provided between the second layer 12 and the first p-side interconnect layer 16. As shown in FIG. 25A, the p-side electrode 7 is a laminated film formed of a plurality of layers (e.g., three layers). The p-side electrode 7 has a first film 7a, a second film 7b, and a third film 7c provided in this order from the second layer 12 side.

For example, the first film 7a is a silver (Ag) film having high reflectance with respect to the light emitted by the light emitting layer 13 and the phosphor layer 30. For example, the second film 7b is a titanium (Ti) film, and the third film 7c is a platinum (Pt) film.

Figure 25B:
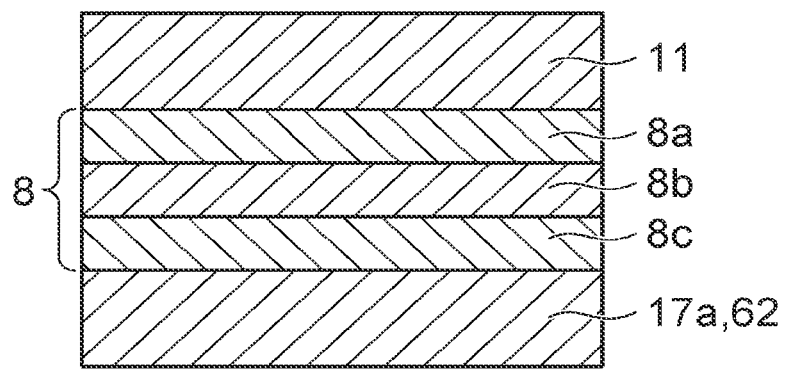

The n-side electrodes 8 are each provided between the first layer 11 and the contact section 17a of the first n-side interconnect layer 17. As shown in FIG. 25B, the n-side electrodes 8 are each a laminated film formed of a plurality of layers (e.g., three layers). The n-side electrodes 8 each have a first film 8a, a second film 8b, and a third film 8c provided in this order from the first layer 11 side.

For example, the first film 8a is an aluminum (Al) film having high reflectance with respect to the light emitted by the light emitting layer 13 and the phosphor layer 30. For example, the second film 8b is a titanium (Ti) film, and the third film 8c is a platinum (Pt) film.

Figure 8A:
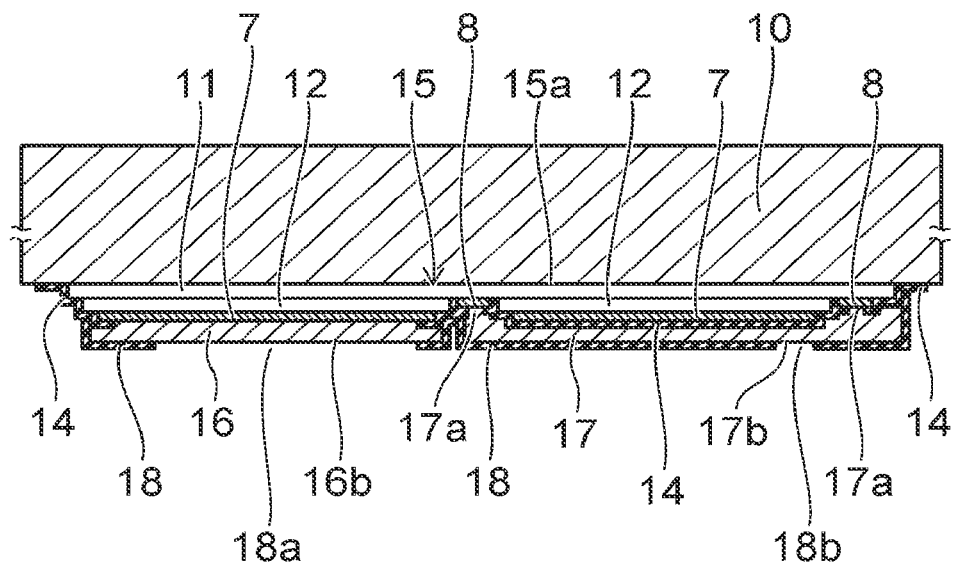
Figure 8B:
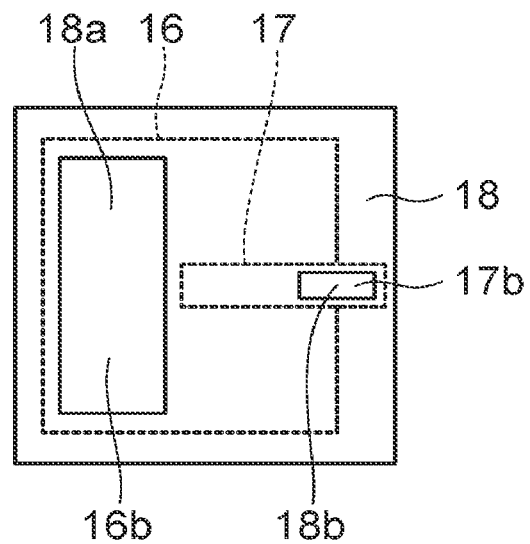

As shown in FIG. 8A and FIG. 8B corresponding to the bottom view of FIG. 8A, an insulating film 18 is provided on surfaces of the first p-side interconnect layer 16 and the first n-side interconnect layer 17. The insulating film 18 is also provided between the first p-side interconnect layer 16 and the first n-side interconnect layer 17. The insulating film 18 is, for example, an inorganic film such as a silicon oxide film.

The insulating film 18 is provided with a first opening 18a for exposing a part (a p-side pad 16b) of the first p-side interconnect layer 16, and a second opening 18b for exposing a part (an n-side pad 17b) of the first n-side interconnect layer 17.

The area of the p-side pad 16b is larger than the area of the n-side pad 17b. The area of the n-side pad 17b is larger than the contact area between the first n-side interconnect layer 17 and the n-side electrode 8.

The substrate 10 provided on the first surface 15a is removed as described later. On the first surface 15a where the substrate 10 is removed, there is provided an optical layer for providing a desired optical characteristic to an emitted light from the semiconductor device. The optical layer has transparency. For example, as shown in FIG. 1, on the first surface 15a (on the first layer 11) of the semiconductor layer 15, there is provided the phosphor layer 30, and further, a transparent layer 33 (a first transparent layer) is provided on the phosphor layer 30.

The phosphor layer 30 includes a plurality of phosphor particles 31. The phosphor particles 31 are excited by radiation light of the light emitting layer 13, and radiate light different in wavelength from the radiation light. The plurality of phosphor particles 31 is dispersed in a binder 32. The binder 32 transmits the radiation light of the light emitting layer 13 and the radiation light of the phosphor particles 31. Thus, the phosphor layer 30 (the third layer) has transparency with respect to the radiation light of the light emitting layer 13 and the radiation light of the phosphor particles 31. Here, "transmitting" includes not only the fact that the transmittance is 100%, but also the case of absorbing a part of the light. As the binder 32, there can be used transparent resin such as silicone resin.

The transparent layer 33 does not include the phosphor particles. Further, the transparent layer 33 protects the phosphor layer 30 when grinding a surface of an insulating member 27 described later.

Alternatively, the transparent layer 33 functions as a light scattering layer. Specifically, the transparent layer 33 includes a plurality of scattering material (e.g., a silicon oxide, a titanium compound) particles for scattering the radiation light of the light emitting layer 13, and a binder (e.g., transparent resin) for transmitting the radiation light of the light emitting layer 13. Thus, the phosphor layer 33 (the fourth layer) has, for example, transparency with respect to the radiation light of the light emitting layer 13 and the radiation light of the phosphor particles 31.

In an out-of-chip region located outside the side surface of the phosphor layer 30, there is provided an insulating member 27. The insulating member 27 has a upper surface 27a and a lower surface. A height of the lower surface is higher than a height of the first surface 15a of the semiconductor layer 15. Here, "height" is the height in a direction from the second surface 11a to the first surface 15a, and is regard as a height of the first surface 15a being higher than a height of the second surface 11a. The insulating member 27 is not provided on the periphery of the side surface of the semiconductor layer 15. The insulating member 27 covers the periphery of the optical layer (the phosphor layer 30 and the transparent layer 33) and supports the chip 3 including the semiconductor layer 15 from the side surface side.

An upper surface 27a of the insulating member 27 and an upper surface of the transparent layer 33 form a flat surface. On a lower surface of the insulating member 27 (a surface on an opposite side to the upper surface 27a), there is provided an insulating film 26.

The insulating film 26 is provided on the periphery of the semiconductor layer 15, and covers the periphery of the semiconductor layer 15 via the insulating film 14. A part of the periphery of the optical layer, which is not covered with the insulating member 27, is covered with the insulating film 26.

A lower surface of the insulating member 27 and a surface of the phosphor layer 30 facing to the semiconductor layer 15 form a step. The step is covered with the insulating film 26. Specifically, corners of the phosphor layer 30, which are located on the semiconductor layer 15 side, are not covered with the insulating member 27 but are covered with the insulating film 26.

On the first p-side pad 16b of the first p-side interconnect layer 16, there is provided a second p-side interconnect layer 21. The second p-side interconnect layer 21 has contact with the first p-side pad 16b of the first p-side interconnect layer 16, and at the same time, extends to the out-of-chip region. A part of the second p-side interconnect layer 21 extending to the out-of-chip region is supported by the insulating member 27 via the insulating film 26. The second p-side interconnect layer 21 is integrally provided so as to overlap each of the semiconductor layer 15 and the insulating member 27.

Further, a part of the second p-side interconnect layer 21 also extends to a region, which overlaps the first n-side interconnect layer 17 via the insulating film 18.

On the first n-side pad 17b of the first n-side interconnect layer 17, there is provided a second n-side interconnect layer 22. The second n-side interconnect layer 22 has contact with the first n-side pad 17b of the first n-side interconnect layer 17, and at the same time, extends to the out-of-chip region. A part of the second n-side interconnect layer 22 extending to the out-of-chip region is supported by the insulating member 27 via the insulating film 26. The second n-side interconnect layer 22 is integrally provided so as to overlap each of the semiconductor layer 15 and the insulating member 27.

As shown in FIG. 1, the insulating film 26 is provided on, for example, step sections between the first interconnect layers 16, 17 and the insulating member 27. The insulating film 26 is provided between each of the second interconnect layers 21, 22 and the insulating member 27, and has contact with each of the second interconnect layers 21, 22, and the insulating member 27.

Figure 17A:
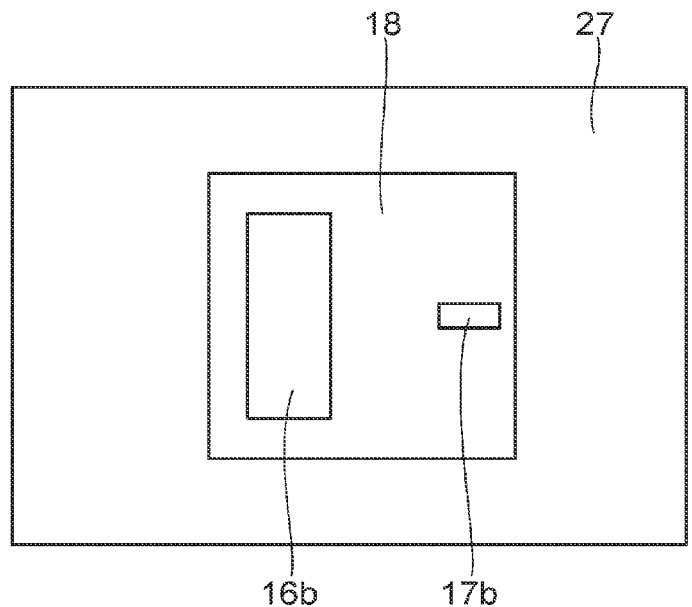
Figure 17B:
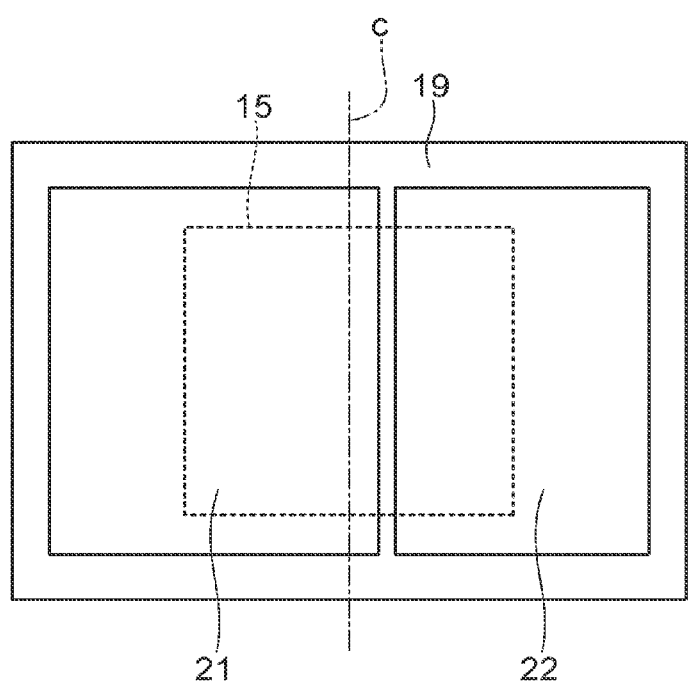

FIG. 17B shows an example of a planar layout of the second p-side interconnect layer 21 and the second n-side interconnect layer 22.

The second p-side interconnect layer 21 and the second n-side interconnect layer 22 are provided asymmetrically about a center line c dividing the planar region of the semiconductor layer 15 into two equal parts, and the area of a lower surface (a surface on the mounting surface side) of the second p-side interconnect layer 21 is larger than the area of a lower surface of the second n-side interconnect layer 22.

As shown in FIG. 1, an insulating film 19 is provided on surfaces of the second p-side interconnect layer 21 and the second n-side interconnect layer 22. The insulating film 19 is, for example, an inorganic film such as a silicon oxide film.

Figure 14:
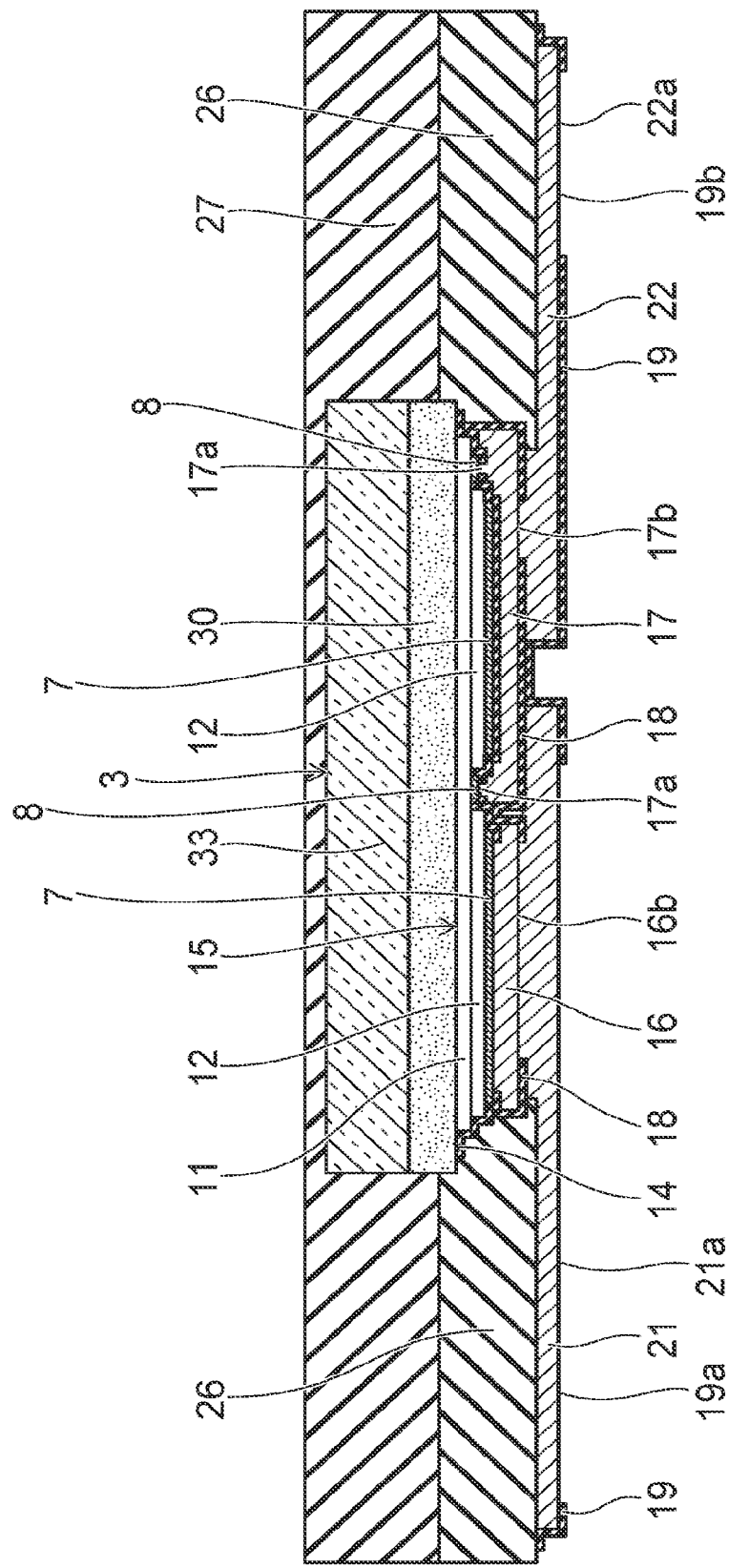

As shown in FIG. 14, the insulating film 19 is provided with a first opening 19a for exposing a second p-side pad 21a of the second p-side interconnect layer 21, and a second opening 19b for exposing a second n-side pad 22a of the second n-side interconnect layer 22.

As shown in FIG. 1, on the second p-side pad 21a of the second p-side interconnect layer 21, there is provided a p-side external connection electrode 23. The p-side external connection electrode 23 is provided on the second p-side interconnect layer 21 so as to be in contact with the second p-side pad 21a of the second p-side interconnect layer 21. The p-side external connection electrode 23 is provided so as to overlap the insulating member 27.

Further, a part of the p-side external connection electrode 23 is also provided in a region, which overlaps the first n-side interconnect layer 17 via the insulating films 18, 19, and a region, which overlaps the second n-side interconnect layer 22 via the insulating film 19.

The p-side external connection electrode 23 spreads in a chip region overlapping the semiconductor layer 15 and the out-of-chip region. The thickness of the p-side external connection electrode 23 is thicker than the thickness of the first p-side interconnect layer 16, and is thicker than the thickness of the second p-side interconnect layer 21.

On the second n-side pad 22a of the second n-side interconnect layer 22, there is provided an n-side external connection electrode 24. The n-side external connection electrode 24 is provided in the out-of-chip region, and has contact with the second n-side pad 22a of the second n-side interconnect layer 22. The n-side external connection electrode 24 is provided so as to overlap the insulating member 27.

The n-side external connection electrode 24 is thicker than the first n-side interconnect layer 17, and is thicker than the second n-side interconnect layer 22.

A resin layer (an insulating layer) 25 is provided between the p-side external connection electrode 23 and the n-side external connection electrode 24. A space between the p-side external connection electrode 23 and the n-side external connection electrode 24 is filled with a resin layer 25 so that the resin layer 25 has contact with a side surface of the p-side external connection electrode 23 and a side surface of the n-side external connection electrode 24. The resin layer 25 is also provided on the periphery of the second p-side interconnect layer 21 and the periphery of the second n-side interconnect layer 22.

Further, the resin layer 25 is provided on the periphery of the p-side external connection electrode 23 and the periphery of the n-side external connection electrode 24, and covers the side surface of the p-side external connection electrode 23 and the side surface of the n-side external connection electrode 24.

The resin layer 25 increases the mechanical strength of the p-side external connection electrode 23 and the n-side connection electrode 24. Further, the resin layer 25 functions as a solder resist for preventing solder from spreading when performing mounting.

A lower surface of the p-side external connection electrode 23 is exposed from the resin layer 25, and functions as a p-side mounting surface (a p-side external terminal) 23a connectable to an external circuit on a mounting board or the like. A lower surface of the n-side external connection electrode 24 is exposed from the resin layer 25, and functions as an n-side mounting surface (an n-side external terminal) 24a connectable to an external circuit on the mounting board or the like. The p-side mounting surface 23a and the n-side mounting surface 24a are bonded to a land pattern on the mounting board via, for example, solder or an electrically-conductive bonding material.

Here, it is further desirable to make the p-side mounting surface 23a and the n-side mounting surface 24a project from a surface of the resin layer 25. Thus, the solder shape of the connection section mounted is stabilized, and it is possible to improve the reliability of mounting.

FIG. 2 shows an example of a planar layout of the p-side mounting surface 23a and the n-side mounting surface 24a.

The p-side mounting surface 23a and the n-side mounting surface 24a are arranged asymmetrically about the center line c dividing the planar region of the semiconductor layer 15 into two equal parts, and the area of the p-side mounting surface 23a is larger than the area of the n-side mounting surface 24a.

The distance between the p-side mounting surface 23a and the n-side mounting surface 24a is set to a distance with which a solder bridge does not occur between the p-side mounting surface 23a and the n-side mounting surface 24a.

An n-side electrode contact surface (the second surface 11a of the first layer 11) in the semiconductor layer 15 is relocated into a larger region including the out-of-chip region using the first n-side interconnect layer 17 and the second n-side interconnect layer 22. Thus, it becomes possible to decrease the area of the n-side electrode surface in the semiconductor layer 15 while ensuring the area of the n-side mounting surface 24a sufficient for reliable mounting. Therefore, it becomes possible to reduce the area of the regions 15e of the semiconductor 15, which does not include the light emitting layer 13, to increase the area of the region 15d including the light emitting layer 13 to thereby improve the light output.

According to the semiconductor light emitting device according to the embodiment, the p-side metal layer 71 (p-side metal portion) and the n-side metal layer 72 (n-side metal portion) are provided on the mounting surface side. The p-side metal layer 71 includes the first p-side interconnect layer 16, the second p-side interconnect layer 21, and the p-side external connection electrode 23. The n-side metal layer 72 includes the first n-side interconnect layer 17, the second n-side interconnect layer 22, and the n-side external connection electrode 24. The p-side metal layer 71 is in contact with the p-side electrode 7, and extends toward an region overlapping the insulating member 27. The n-side metal layer 72 is in contact with the n-side electrode 8, and extends toward an region overlapping the insulating member 27.

The semiconductor layer 15 is formed on the substrate using an epitaxial growth method. The substrate is removed, and the semiconductor layer 15 does not include the substrate on the first surface 15a side. By removing the substrate, reduction of height of the semiconductor light emitting device can be achieved. Further, by removing the substrate, it is possible to form a fine concavo-convex pattern on the first surface 15a of the semiconductor 15, and thus, an improvement in light extraction efficiency can be achieved.

The semiconductor layer 15 is supported on a support body formed of a composite body of the metal layers 71, 72 and the resin layer 25. Further, the semiconductor layer 15 is supported from the side surface side by the insulating member 27 as, for example, a resin layer thicker than the semiconductor layer 15.

As the material of the metal layers 71, 72, for example, copper, gold, nickel, and silver can be used. Among these materials, by using copper, good thermal conductivity, and high migration resistance can be obtained, and adhesiveness to the insulating material can be improved.

For example, due to the thermal cycle in mounting the semiconductor light emitting device, the stress caused by the solder for bonding the p-side mounting surface 23a and the n-side mounting surface 24a to the lands on the mounting board is applied to the semiconductor layer 15. By forming the p-side external connection electrode 23, the n-side external connection electrode 24, and the resin layer 25 to have appropriate thickness (height), it is possible for the p-side external connection electrode 23, the n-side external connection electrode 24, and the resin layer 25 to absorb and relax the stress described above. In particular, by using the resin layer 25 more flexible than the semiconductor layer 15 on the mounting surface side as a part of the support body, the stress relaxation effect can be enhanced.

According to the embodiment, the insulating member 27 has the lower surface. The height of the lower surface is higher than the height of the first surface 15a of the semiconductor layer 15. The insulating member 27 is provided nearer to the optical layer than the first surface 15a of the semiconductor layer 15, but is not provided on the periphery of the semiconductor layer 15. The insulating member 27 is provided only on the periphery of the optical layer. In this case, the insulating film 26 is provided on the periphery of the semiconductor layer 15 and the periphery of the optical layer. Therefore, it is possible to increase the volume of the insulating film 26 compared to the case of providing the insulating film 26 only on the periphery of the semiconductor layer 15.

As the insulating film 26, a material more flexible than the semiconductor layer 15 can be used similarly to the case of the resin layer 25. A Young's modulus of the insulating film 26 is, for example, lower than a Young's modulus of the insulating member 27. Therefore, by using the insulating film 26 on the mounting surface side as a part of the support body, the stress relaxation effect can be enhanced. For the insulating member 27, a material suitable for light reflection can be selected as described later, and for the insulating film 26, a material suitable for stress relaxation can be selected. Further, the insulating member 27 can be separated from the semiconductor layer 15 via the insulating film 26.

Further, in forming the insulating member 27 described later, a stress occurs. For example, when the insulating member 27 is formed on the periphery of the semiconductor layer 15, stress concentration on the semiconductor layer 15 can occur. According to the embodiment, the insulating member 27 is not formed on the periphery of the semiconductor layer 15. Therefore, it is possible to form the insulating member 27 without concentrating the stress on the semiconductor layer 15.

The metal layers 71, 72 each include, for example, copper having high thermal conductivity as a principal component, and the highly thermal conductive body spreads in the region overlapping the light emitting layer 13 with a large area. The heat generated in the light emitting layer 13 is released to the mounting board with a short path formed below the chip through the metal layers 71, 72.

In particular, since the p-side mounting surface 23a of the p-side metal layer 71 connected to the light emitting region 15d of the semiconductor layer 15 overlaps most part of the planar region of the semiconductor layer 15 in the planar view shown in FIG. 2, it is possible to release the heat to the mounting board with high efficiency through the p-side metal layer 71.

Further, according to the embodiment, the p-side mounting surface 23a also expands to the out-of-chip region. Therefore, the planar size of the solder bonded to the p-side mounting surface 23a can also be increased, and thus, the heat radiation property to the mounting board via the solder can be enhanced.

Further, the second n-side interconnect layer 22 extends to the out-of-chip region. Therefore, it is possible to provide the n-side mounting surface 24a in the out-of-chip region without being subject to the restriction of the p-side mounting surface 23a arranged so as to constitute a large part of the region overlapping the chip. By arranging the n-side mounting surface 24a in the out-of-chip region, it is possible to increase the area compared to the case of arranging the n-side mounting surface 24a only within a range of the chip region.

In addition to the above, since the insulating member 27 is not provided nearer to the mounting surface than the first surface 15a, the freedom of layout of the n-side interconnect layer 22 is enhanced.

Therefore, regarding the n-side, the planar size of the solder bonded to the n-side mounting surface 24a can also be increased, and thus, the heat radiation property to the mounting board via the solder can be enhanced.

The light radiated from the light emitting layer 13 toward the first surface 15a enters the phosphor layer 30, and a part of the light excites the phosphor particles 31, and thus, white light, for example, can be obtained as mixed light of the radiation light of the light emitting layer 13 and the light of the phosphor particles 31.

The light radiated from the light emitting layer 13 toward the mounting surface is reflected by the p-side electrode 7 and the n-side electrodes 8, and then proceeds toward the phosphor layer 30 located above.

The transparent layer (the first transparent layer) 33 is provided on the phosphor layer 30, and a transparent layer (a second transparent layer) 34 is provided on the transparent layer 33 and the insulating member 27 in the out-of-chip region.

The transparent layer 34 includes a plurality of scattering material (e.g., a silicon oxide) particles for scattering the radiation light of the light emitting layer 13, and a binder (e.g., transparent resin) for transmitting the radiation light of the light emitting layer 13.

The transparent layer 34 functions as a light scattering layer. The planar size of the transparent layer 34 as the light scattering layer is larger than the planar size of the phosphor layer 30 and the planar size of the transparent layer 33. Therefore, the planar size of the transparent layer 34 is larger than the planar size of the chip 3. Therefore, it is possible to enlarge the range of the light emitted from the semiconductor light emitting device to the outside, and thus, a wide-range light distribution characteristic can be achieved. The transparent layer 34 (the fifth layer) has, for example, transparency with respect to the radiation light of the light emitting layer 13 and the radiation light of the phosphor particles 31.

The surface of at least a part of the insulating member 27 adjacent to the side surface of the semiconductor layer 15 has reflectivity with respect to the radiation light of the light emitting layer 13. Further, a part of the insulating member 27 adjacent to the side surface of the phosphor layer 30, and a part adjacent to the side surface of the transparent layer 33 have reflectivity with respect to the radiation light of the light emitting layer 13 and the radiation light of the phosphor particles 31. Further, the vicinity of the boundary of the insulating member 27 with the transparent layer 34 has light reflectivity with respect to the radiation light of the light emitting layer 13 and the radiation light of the phosphor particles 31.

Figure 35A:
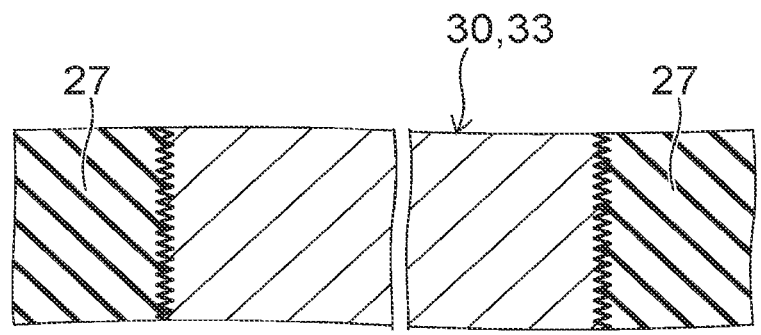
Figure 35B:
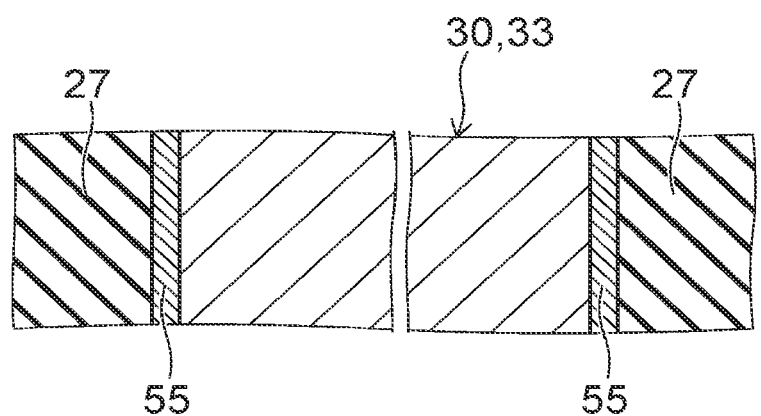

Further, as shown in FIG. 35B, in the insulating member 27, by providing a reflecting layer 55 having reflectivity on the surface of a part adjacent to the side surface of the optical layer (the phosphor layer 30, the transparent layer 33), substantially the same advantage can be obtained.

Here, "reflect" includes not only the fact that the reflectance is 100%, but also the case of absorbing a part of the light. For example, the insulating member 27 is a resin layer having the reflectance of no lower than 50% with respect to the radiation light of the light emitting layer 13 and the radiation light of the phosphor particles 31.

Therefore, the radiation light from the side surface of the chip 3 and the light scattered by the transparent layer 34 and proceeding toward the insulating member 27 can be reflected by the insulating member 27. It is possible to prevent the light absorption loss in the insulating member 27 to thereby improve the light extraction efficiency to the outside through the transparent layer 34. Further, as shown in FIG. 35B, by providing a reflecting layer 55 having reflectivity on the surface (the side surface adjacent to the optical layers 30, 33) of the insulating member 27, substantially the same advantage can also be obtained.

The phosphor layer 30 is formed on the first surface 15a of the semiconductor layer 15 using a wafer-level process, and the planar size of the phosphor layer 30 is roughly equal to or slightly larger than the planar size of the semiconductor layer 15.

The phosphor layer 30 is not formed on the side surface of the semiconductor layer 15 so as to wrap around the side surface thereof toward the mounting surface. Therefore, the phosphor layer 30 is not uselessly formed on the chip side surface and the mounting surface side from which the light is not extracted to the outside, and thus, the cost reduction can be achieved.

In the common flip-chip mounting process, the LED chip is mounted on the mounting board via bumps or the like, and then the phosphor layer is formed so as to entirely cover the chip. Alternatively, underfill resin is provided between the bumps.

In contrast, according to the semiconductor light emitting device related to the embodiment, in the state in which mounting is not performed as shown in FIG. 1, a resin layer 25 different from the phosphor layer 30 is provided on the periphery of the p-side external connection electrode 23 and the periphery of the n-side external connection electrode 24, and thus, the characteristic suitable for stress relaxation can be provided to the mounting surface side. Further, since the resin layer 25 has already been provided on the mounting surface side, the underfill after mounting becomes unnecessary.

On the first surface 15a side of the semiconductor layer 15, there is provided the optical layer designed so as to give priority to the light extraction efficiency, the color conversion efficiency, the light distribution characteristic, and so on, and on the mounting surface side, there is provided the layer giving priority to the stress relaxation when mounting, and the characteristic as a support body instead of the substrate. For example, the resin layer 25 has a structure obtained by densely filling the resin to be the base with a filler such as silica particles, and is adjusted to have an appropriate hardness as the support body.

According to the embodiment explained hereinabove, the semiconductor layer 15, the electrodes 7, 8, the on-chip interconnect layers 16, 17, and the optical layer are formed in a lump wafer by wafer to realize the low-cost chip-size device 3, and at the same time, the external terminals (the mounting surface) 23a, 34a are expanded to the out-of-chip region, and thus, the heat radiation property can be improved. Therefore, a semiconductor device low in price and high in reliability can be provided.

Further, by providing the insulating member 27 only in an area nearer to the optical layer than the first surface 15a of the semiconductor layer 15, the stress relaxation effect can be enhanced, and it is possible to provide the semiconductor light emitting device superior in stress relaxation property.

Then, a method of manufacturing the semiconductor light emitting device according to the embodiment will be explained with reference to FIGS. 4A through 17B.

FIGS. 4B, 5B, 6B, 7B, 8B, 17A, and 17B correspond to the bottom views of FIGS. 4A, 5A, 6A, 7A, 8A, 13, and 14, respectively.

The semiconductor layer 15 is epitaxially grown on the substrate 10 using, for example, a metal organic, chemical vapor deposition (MOCVD) method. The substrate 10 is, for example, a silicon substrate. Alternatively, the substrate 10 can also be a sapphire substrate or a silicon carbide substrate. The semiconductor layer 15 is, for example, a nitride semiconductor layer including gallium nitride (GaN).

The laminated film of the second layer 12 and the light emitting layer 13 is selectively etched using, for example, a reactive ion etching (RIE) method to expose the second surface 11a of the first layer 11 as shown in FIGS. 4A and 4B.

Further, the first layer 11 is selectively removed to be separated into a plurality of semiconductor layers 15 on the substrate 10. The grooves for separating the semiconductor layer 15 into a plurality of parts are formed of, for example, a grid-like pattern.

Then, as shown in FIGS. 5A and 5B, the p-side electrode 7 is formed on the surface of the second layer 12, and the n-side electrodes 8 are formed on the second surface 11a of the first layer 11.

Then, as shown in FIGS. 6A and 6B, the insulating film 14 is formed so as to cover the semiconductor layer 15 and the electrodes 7, 8, and then, the first opening 14a and the second openings 14b are provided to the insulating film 14.

Then, as shown in FIGS. 7A and 7B, the first p-side interconnect layer 16 and the first n-side interconnect layer 17 are formed. The first p-side interconnect layer 16 is formed in the first opening 14a, and has contact with the p-side electrode 7.

The first n-side interconnect layer 17 is also provided in the second openings 14b, and has contact with the n-side electrodes 8. Further, the first n-side interconnect layer 17 has contact with the n-side electrodes 8 at, for example, two places. The first n-side interconnect layer 17 is formed to have a linear shape extending in a direction connecting the n-side electrodes 8 located at the two places. The insulating film 14 intervenes between the part of the first n-side interconnect layer 17 formed to have the linear shape and the p-side electrode 7, and the first n-side interconnect layer 17 is not in contact with the p-side electrode 7.

The p-side electrode 7, the n-side electrodes 8, the first p-side interconnect layer 16, and the first n-side interconnect layer 17 are formed within a range of the region overlapping the semiconductor layer 15.

Then, as shown in FIGS. 8A and 8B, the insulating film 18 is formed on the surface of the first p-side interconnect layer 16 and the surface of the first n-side interconnect layer 17, and the first opening 18a and the second opening 18b are provided to the insulating film 18. The first p-side pad 16b of the first p-side interconnect layer 16 is exposed in the first opening 18a, and the first n-side pad 17b of the first n-side interconnect layer 17 is exposed in the second opening 18b.

Then the substrate 10 is removed. In the state in which the laminated body including the semiconductor layer 15 and the first interconnect layers 16, 17 is supported by a temporary support body not shown, the substrate 10 is removed.

For example, the substrate 10 as the silicon substrate is removed by dry etching such as RIE. Alternatively, it is also possible to remove the silicon substrate 10 by wet etching. Alternatively, in the case in which the substrate 10 is a sapphire substrate, the substrate 10 can be removed by a laser lift-off method.

The semiconductor layer 15 epitaxially grown on the substrate 10 includes strong internal stress in some cases. Further, the p-side metal layer 71, the n-side metal layer 72, and the resin layer 25 are formed of a flexible material compared to the semiconductor layer 15 formed of, for example, a GaN series substrate. Therefore, even if the internal stress generated in the epitaxial growth is released at once when exfoliating the substrate 10, the p-side metal layer 71, the n-side metal layer 72, and the resin layer 25 absorb the stress. Therefore, it is possible to avoid the breakage of the semiconductor layer 15 in the process of removing the substrate 10.

The first surface 15a of the semiconductor layer 15 thus exposed by removing the substrate 10 is roughened if needed.

Further, on the first surface 15a, there is formed the phosphor layer 30 described above, and on the phosphor layer 30, there is formed the transparent layer 33. The processes so far are performed in the state of a wafer.

Figure 9:
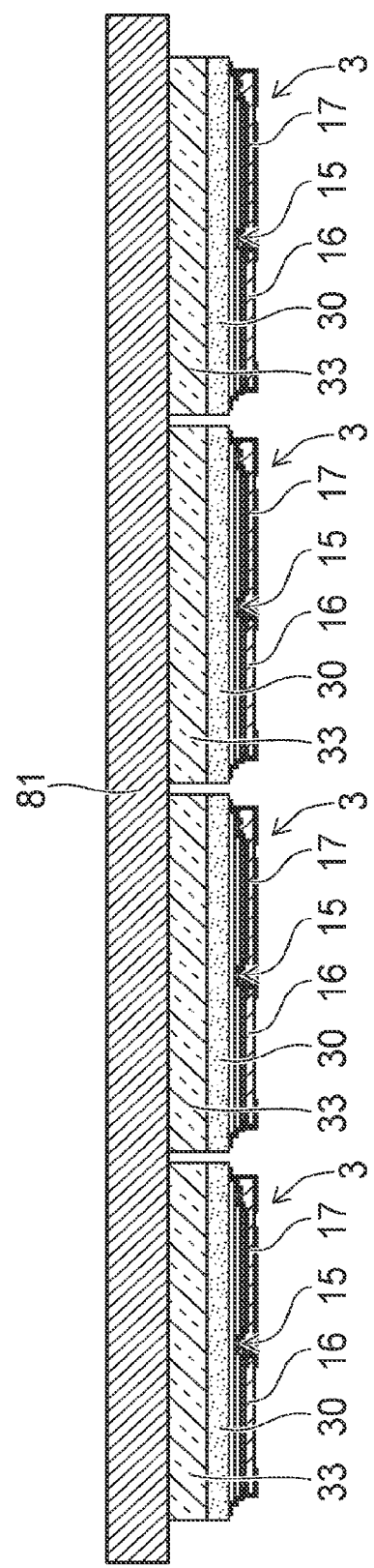

Then, the wafer is diced to be singulated into a plurality of chips 3. The chips 3 are supported by a first support body 81 (a dicing tape) as shown in FIG. 9. The type of the first support body 81 is arbitrary.

On this occasion, for example, before dicing the wafer, the wafer can also be supported by the first support body 81. Thus, it is not necessary to use an additional tape after singulating the plurality of chips 3, and it becomes possible to reduce the cost and the number of processes.

Figure 10:
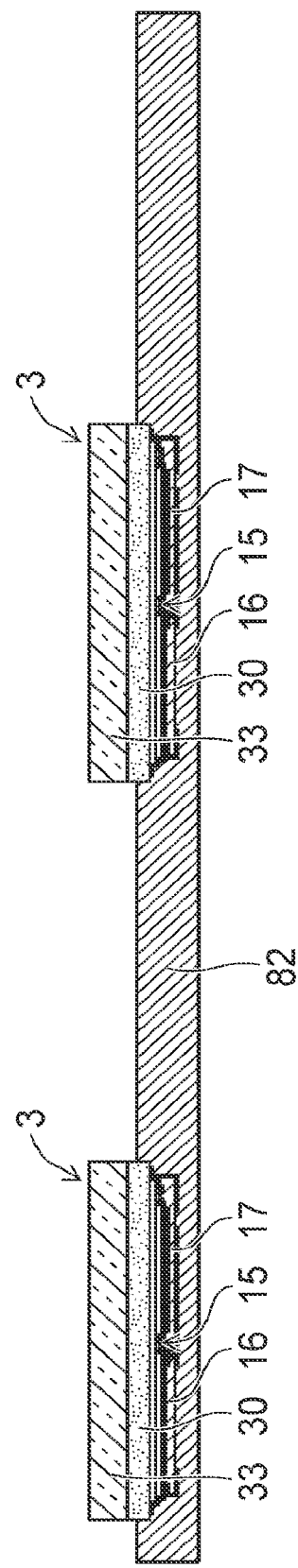

As shown in FIG. 10, the chips 3 are relocated from the first support body 81 to a second support body 82 (a mold tape). The pitch of the chips 3 relocated is arbitrary.

Figure 11:
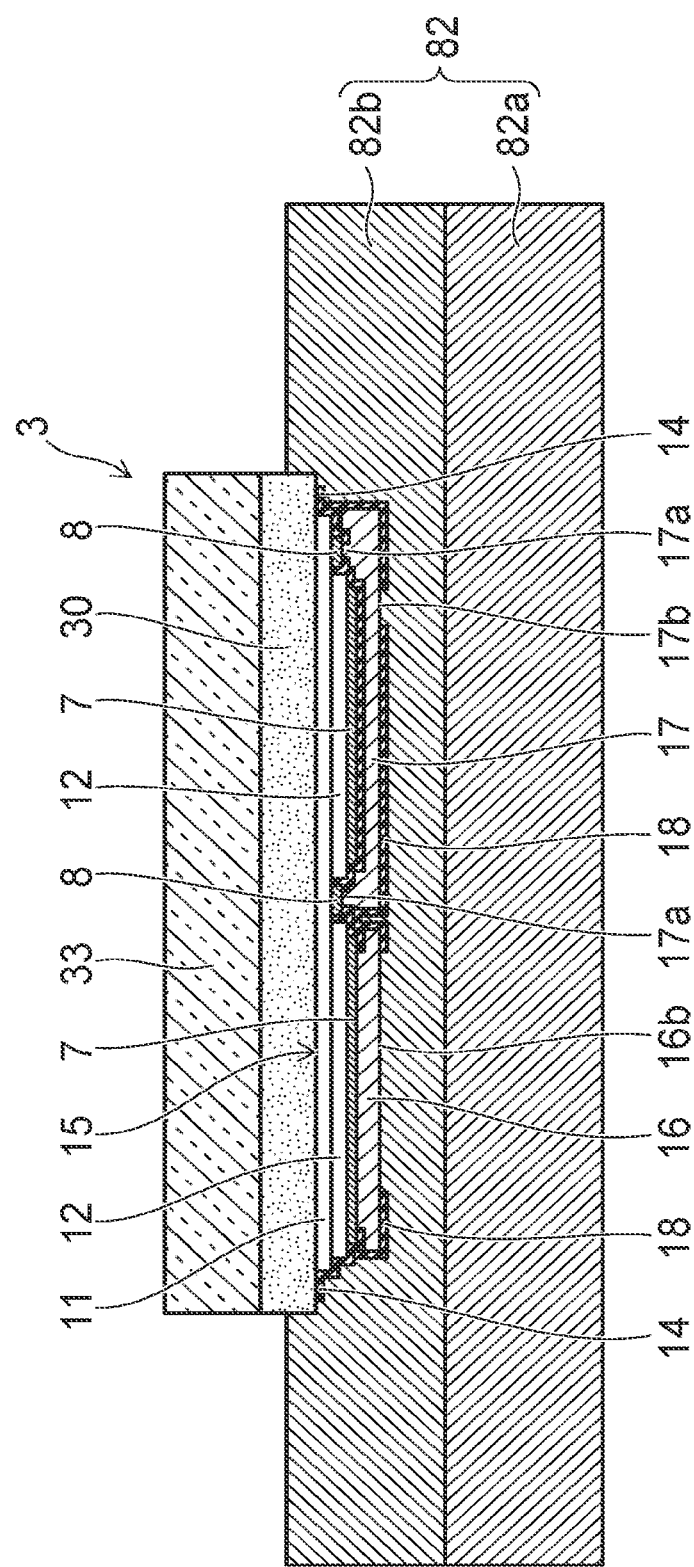

As shown in FIG. 11, the second support body 82 has, for example, a base material 82a and an adhesive layer 82b. The whole of the semiconductor layer 15 and a part of the phosphor layer 30 of the chip 3 are embedded in the adhesive layer 82b.

Figure 12:
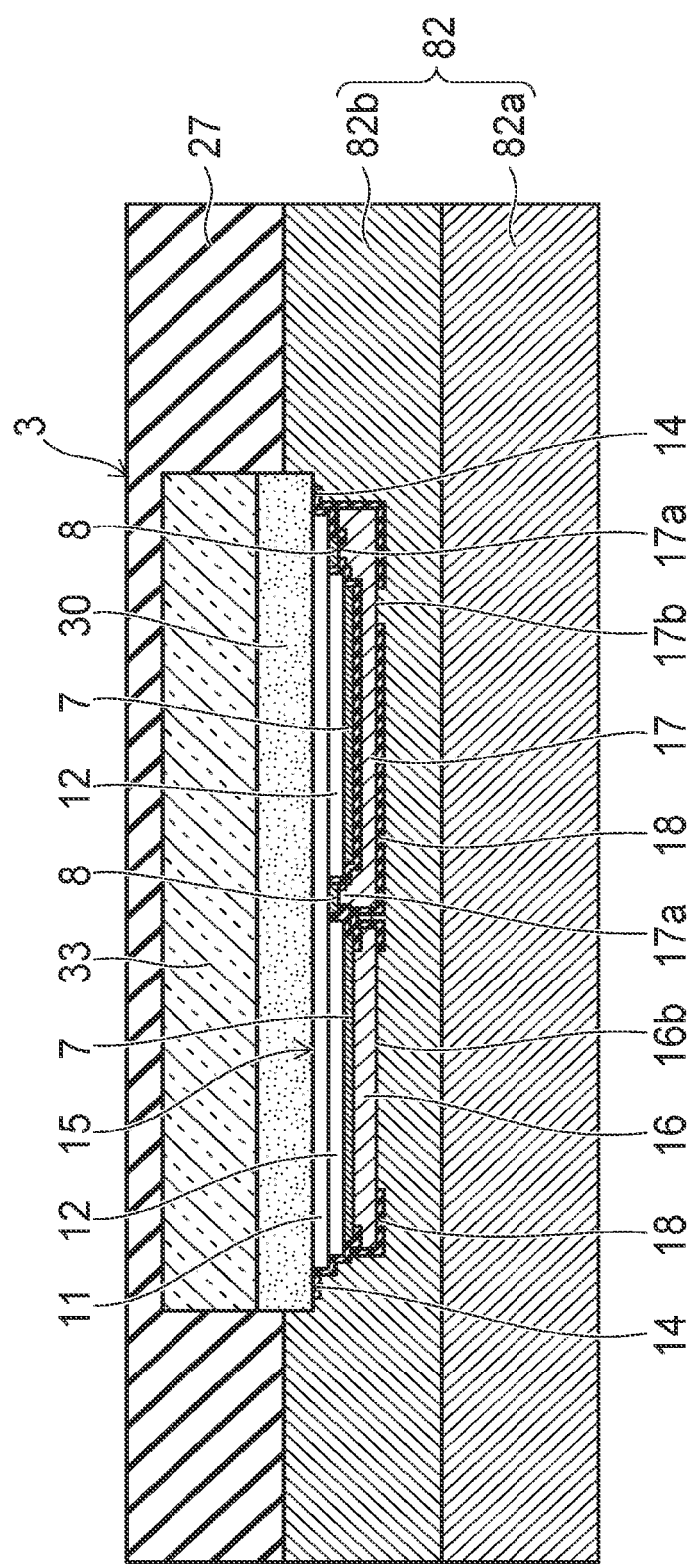

As shown in FIG. 12, the insulating member (a support member) 27 is formed on the periphery (the out-of-chip region) of the chip 3 and on the chip 3 (on the transparent layer 33). On this occasion, the insulating member 27 is not formed on the side surface of the semiconductor layer 15 embedded in the adhesive layer 82b. Thus, the stress generated due to the formation of the insulating member 27 can be dispersed in the whole of the chip 3 and the second support body 82, and it becomes possible to suppress the load (stress concentration) on the semiconductor layer 15.

Figure 13:
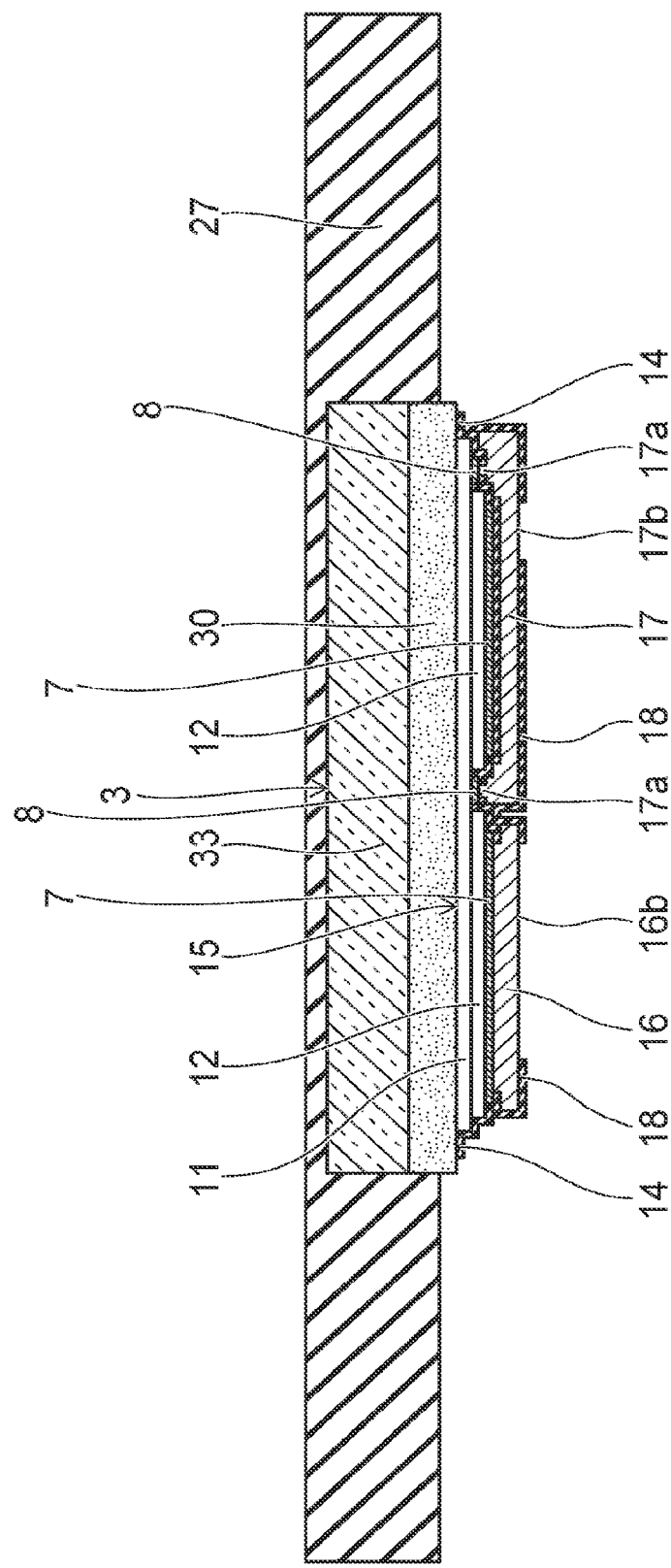

As shown in FIG. 13, the second support body 82 is separated from the chip 3. On this occasion, the stress generated due to the separation of the second support body 82 can be dispersed to the insulating member 27, and thus, the load on the semiconductor layer 15 can be suppressed.

On the lower surface of the insulating member 27 in FIG. 13, there is formed the insulating film 26 as shown in FIG. 14. The insulating film 26 is formed so as to resolve the step between, for example, the chip 3 and the insulating member 27. As the insulating film 26, a variety of resin materials can be used, but imide series resin, phenolic resin, silicone series resin, epoxy type resin superior in heat resistance are suitable.

On the first p-side pad 16b of the first p-side interconnect layer 16 and the insulating film 26 in the out-of-chip region, there is formed the second p-side interconnect layer 21 as shown in FIG. 14. On the first n-side pad 17b of the first n-side interconnect layer 17 and the insulating film 26 in the out-of-chip region, there is formed the second n-side interconnect layer 22.

The second n-side interconnect layer 22 is aligned with the chip 3. Since the first n-side pad 17b is relocated in the larger area than the n-side electrodes 8, the second n-side interconnect layer 22 can surely be overlapped with and connected to the first n-side pad 17b even if the forming position of the second n-side interconnect layer 22 is somewhat shifted from the chip 3.

On the surface of the second p-side interconnect layer 21 and the surface of the second n-side interconnect layer 22, there is formed the insulating film 19. The insulating film 19 is provided with the first opening 19a and the second opening 19b.

In the first opening 19a, there is exposed the second p-side pad 21a of the second p-side interconnect layer 21. In the second opening 19b, there is exposed the second n-side pad 22a of the second n-side interconnect layer 22.

Figure 15:
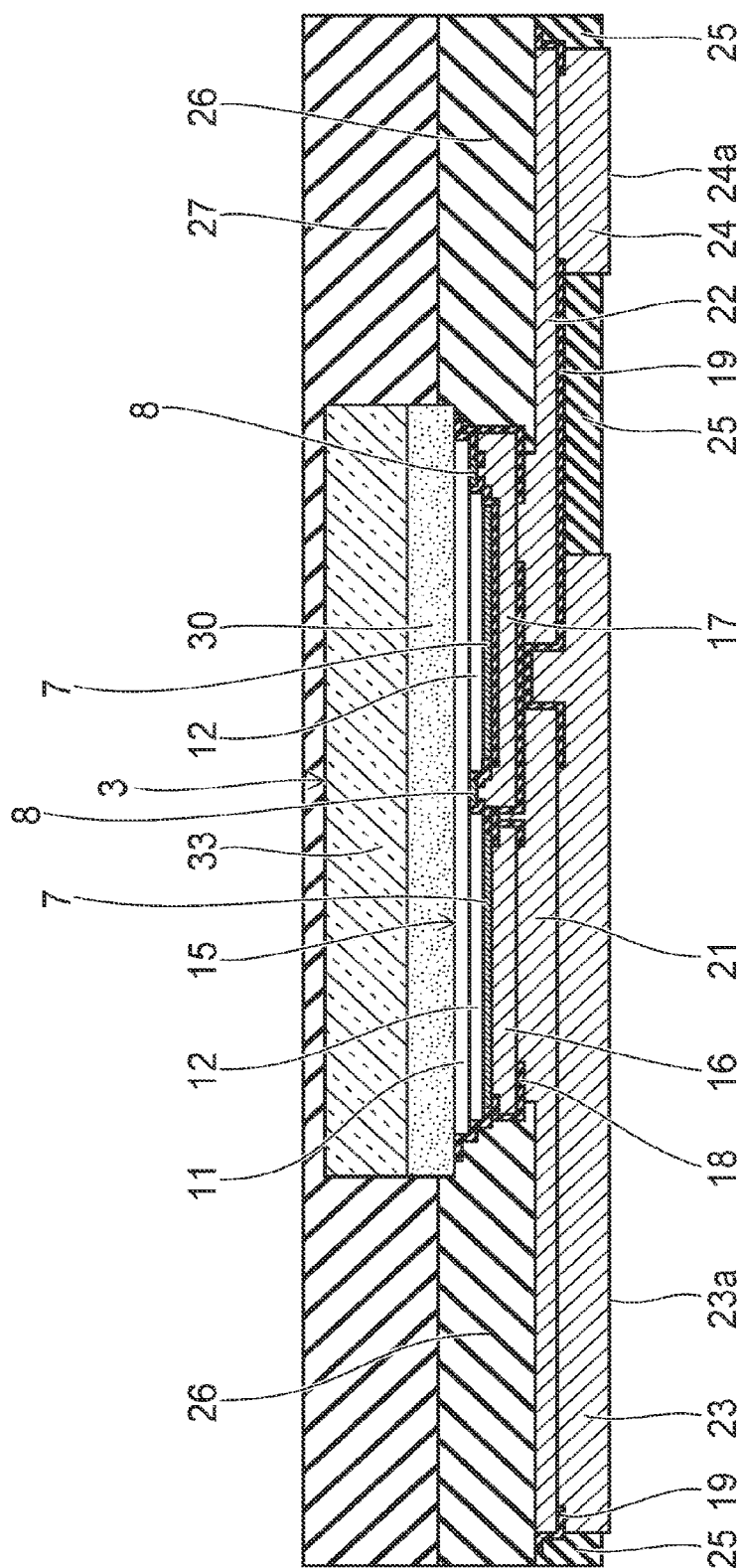

As shown in FIG. 15, on the second p-side pad 21a, there is provided a p-side external connection electrode 23. On the second n-side pad 22a, there is formed the n-side external connection electrode 24. Further, the resin layer 25 is formed between the p-side external connection electrode 23 and the n-side external connection electrode 24, on the periphery of the p-side external connection electrode 23, and on the periphery of the n-side external connection electrode 24. The resin layer 25 is also formed on the periphery of the second p-side interconnect layer 21 and the second n-side interconnect layer 22.

Figure 16:
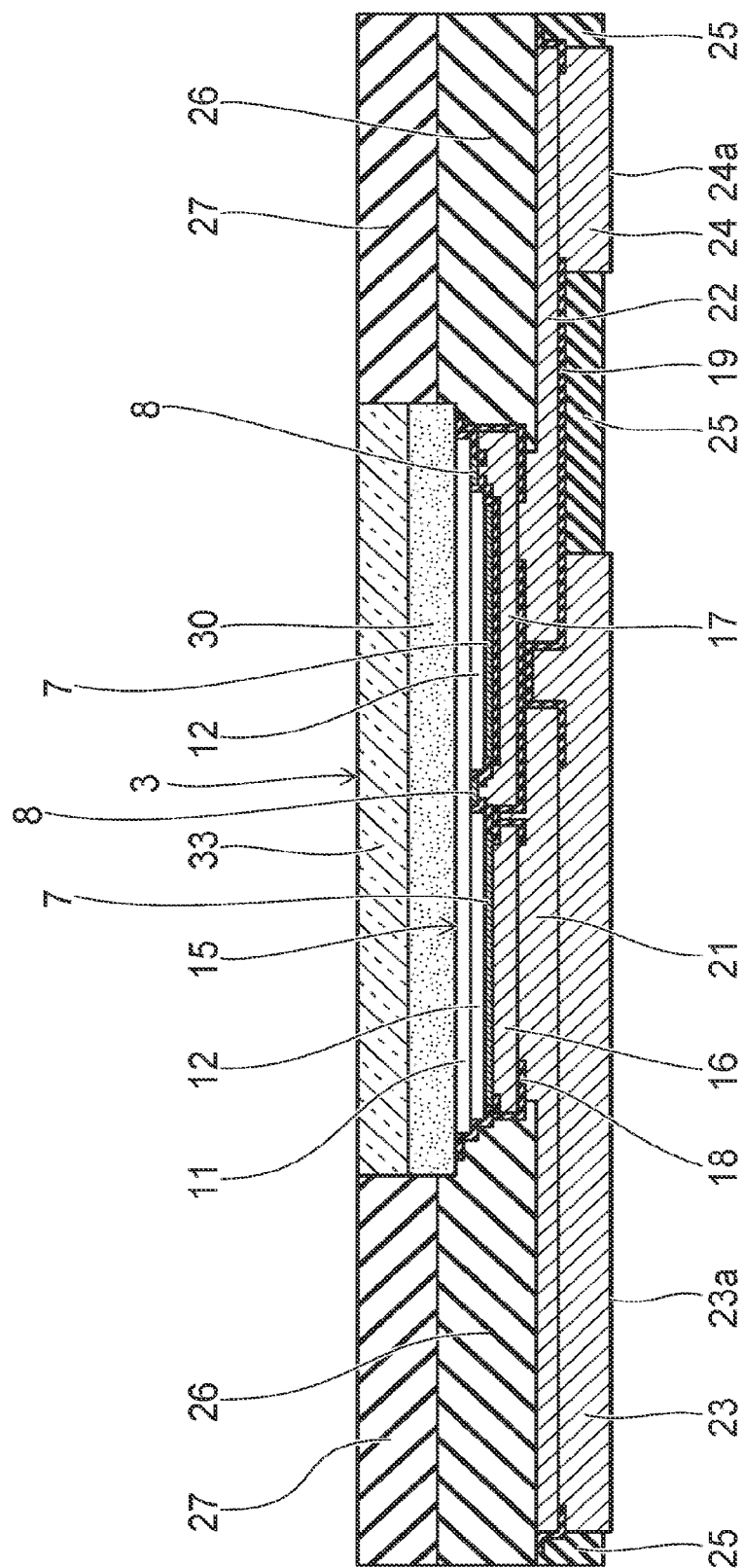

Then, the upper surface of the insulating member 27 on the transparent layer 33, and the upper surface of the insulating member 27 in the out-of-chip region are ground. The insulating member 27 on the transparent layer 33 is removed, and as shown in FIG. 16, the upper surface of the transparent layer 33 and the upper surface of the insulating member 27 in the out-of-chip region are planarized.

On this occasion, the grind is not performed to the height at which the upper surface of the phosphor layer 30 is exposed, and the transparent layer 33 remaining on the phosphor layer 30 protects the phosphor layer 30.

On the upper surface of the transparent layer 33 and the upper surface of the insulating member 27, there is formed a transparent layer (a scattering layer) 34 larger in planar size then the chip 3 as shown in FIG. 1.

According to the embodiment, when forming the insulating member 27 on the periphery of the chip 3 and on the chip 3, the whole of the semiconductor layer 15 of the chip 3 and a part of the phosphor layer 30 are embedded in the second support body 82. Therefore, the insulating member 27 is not formed on the periphery of the semiconductor layer 15. Thus, the stress generated in forming the insulating member 27, the stress generated in separating the second support body 82, and the stress generated in heating when mounting can be dispersed to the part other than the semiconductor layer 15, and thus, the stress relaxation effect can be enhanced.

Then, semiconductor light emitting devices according to other embodiments will be explained with reference to FIGS. 18 through 22. In the semiconductor light emitting devices shown in FIGS. 18 through 22, the same elements as in the semiconductor light emitting device shown in FIG. 1 are denoted with the same reference numbers, and the detailed explanation thereof will be omitted.

Figure 18:
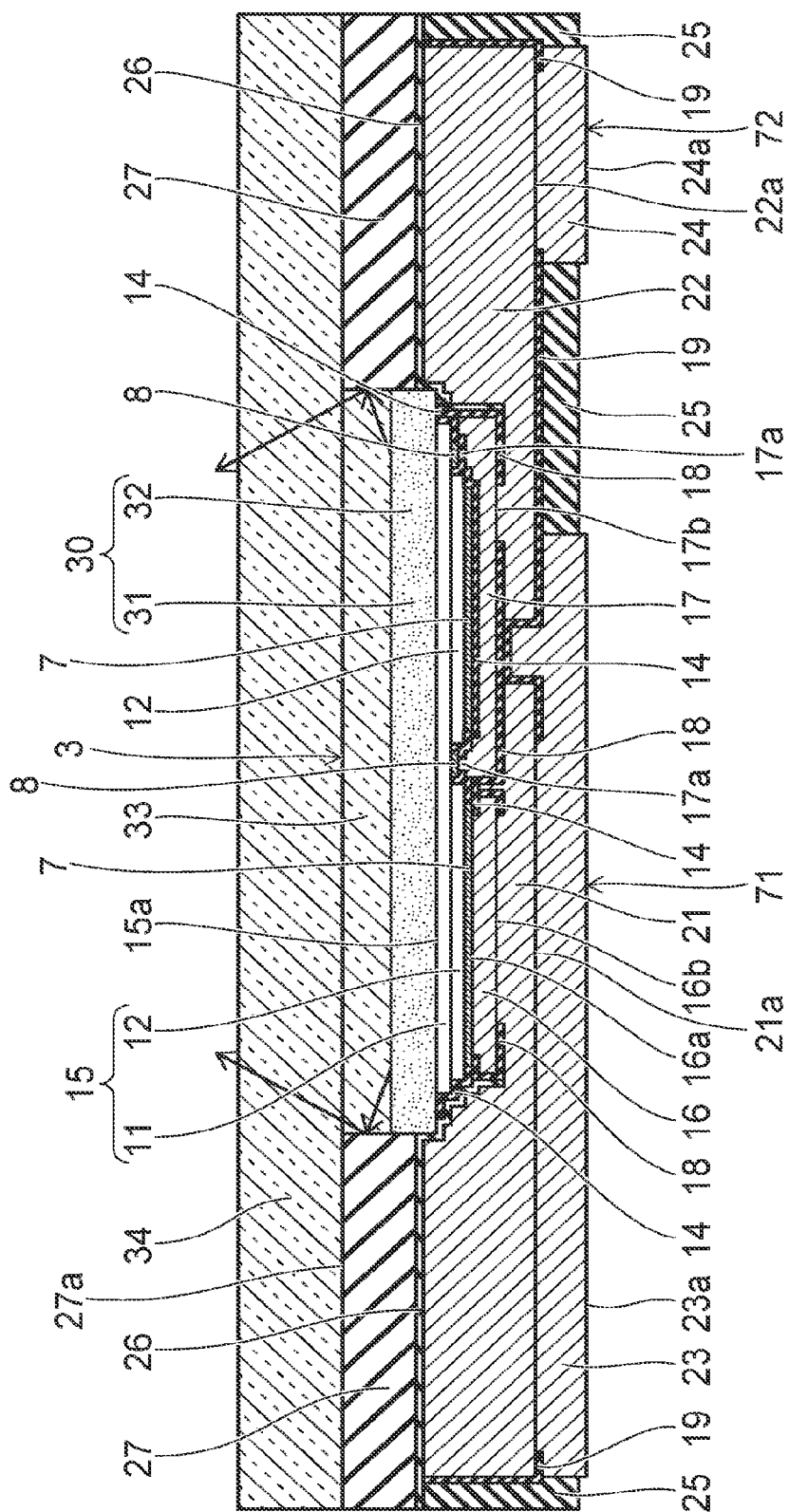
FIG. 18 to FIG. 24 are schematic cross-sectional views of the semiconductor light emitting device of the embodiment.

According to the semiconductor light emitting device shown in FIG. 18, the insulating film 26 is conformally provided to the insulating film 18, the insulating member 27, and the phosphor layer 30. Further, the second interconnect layers 21, 22 are also provided on the step section between the insulating member 27 and the first interconnect layers 16, 17, respectively.

Thus, the thickness of the resin layer 25 provided on the periphery of each of the second interconnect layers 21, 22 can be increased, and thus, the stress relaxation effect can be enhanced.

Figure 19:
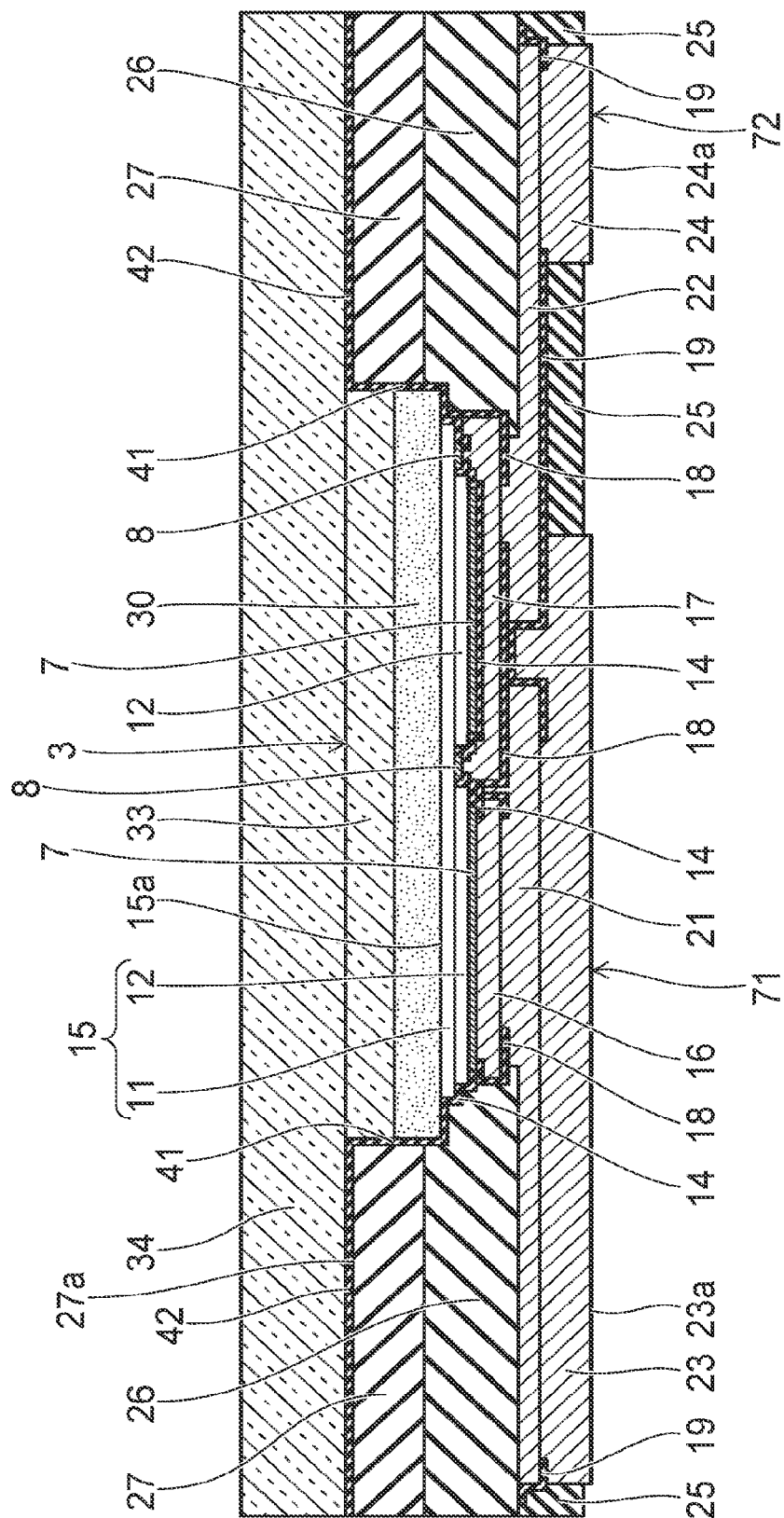

According to the semiconductor light emitting device shown in FIG. 19, an inorganic film 41 is provided between the side surface of the phosphor layer 30 and the insulating film 26, between the side surface of the phosphor layer 30 and the insulating member 27, and between the side surface of the transparent layer 33 and the insulating member 27. Further, an inorganic film 42 is provided between the upper surface 27a of the insulating member 27 and the transparent layer 34.

The inorganic film 41 and the inorganic film 42 are each, for example, a silicon oxide film. The inorganic film 41 enhances the adhesiveness between the phosphor layer 30 and the insulating member 27 (e.g., white resin), and enhances the adhesiveness between the transparent layer 33 and the insulating member 27. The inorganic film 42 enhances the adhesiveness between the insulating member 27 and the transparent layer 34. Further, it is also effective for enhancing the adhesiveness with the insulating member 27 to roughen the side surface of the optical layer (the phosphor layer 30, the transparent layer 33) as shown in FIG. 35A.

Figure 20:
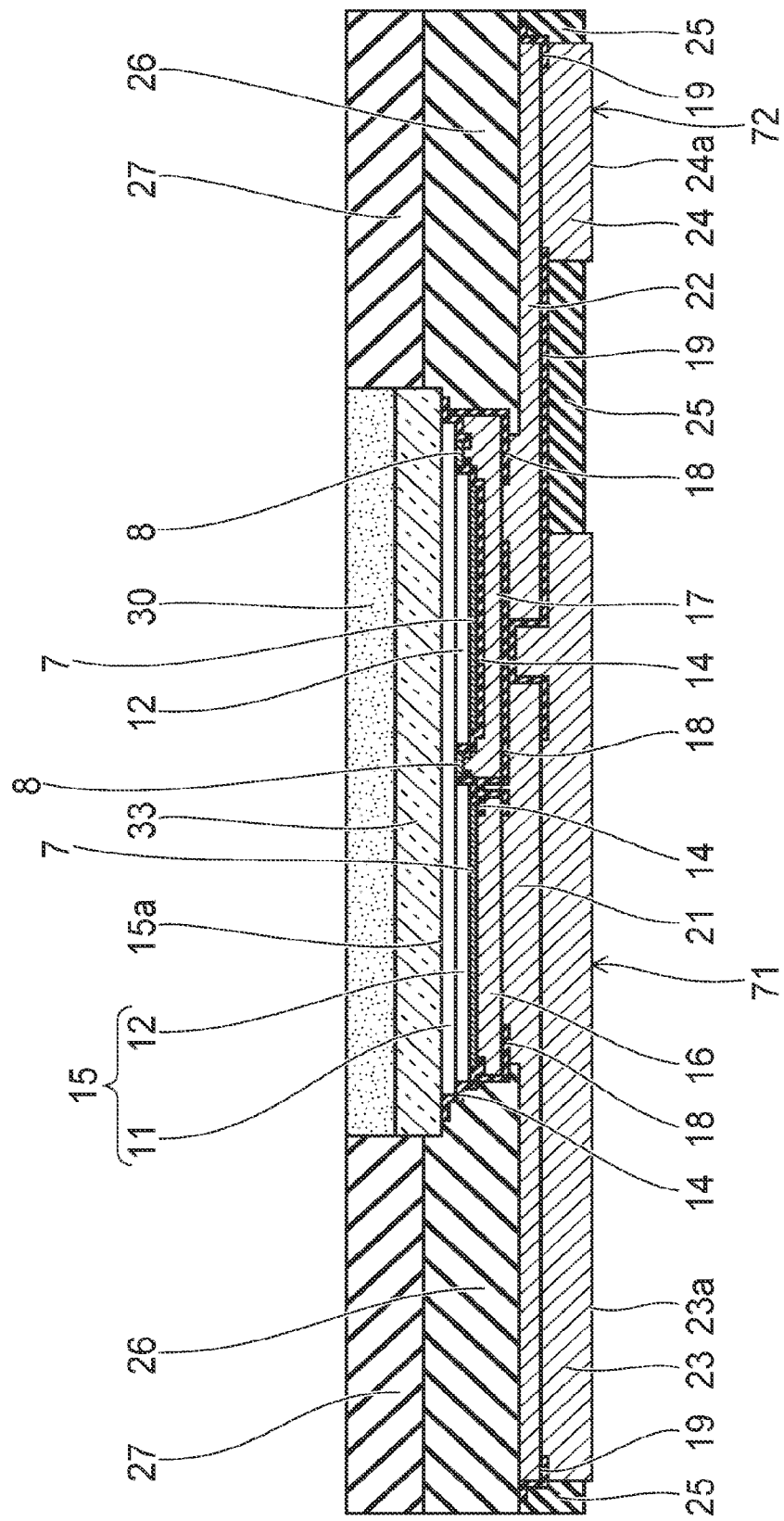

According to the semiconductor light emitting device shown in FIG. 20, a transparent layer 33 is provided on the first surface 15a of the semiconductor layer 15, and the phosphor layer 30 is provided on the transparent layer 33. Alternatively, it is also possible to form an inorganic film such as a silicon oxide film as the transparent layer between the semiconductor layer 15 and the phosphor layer 30 to thereby enhance the adhesiveness between the semiconductor layer 15 and the phosphor layer 30.

By setting the refractive index of the transparent layer 33 to an intermediate value between the refractive index of the semiconductor layer 15 and the refractive index of the phosphor layer 30, it is possible to improve the extraction efficiency of the light from the semiconductor layer 15. Further, due to the transparent layer 33, the distance between the semiconductor layer 15 and the phosphor layer 30 is increased, and thus, it is possible to decrease the ratio of the heat transferred to the semiconductor layer 15 to the heat generated in the phosphor layer 30.

Figure 21:
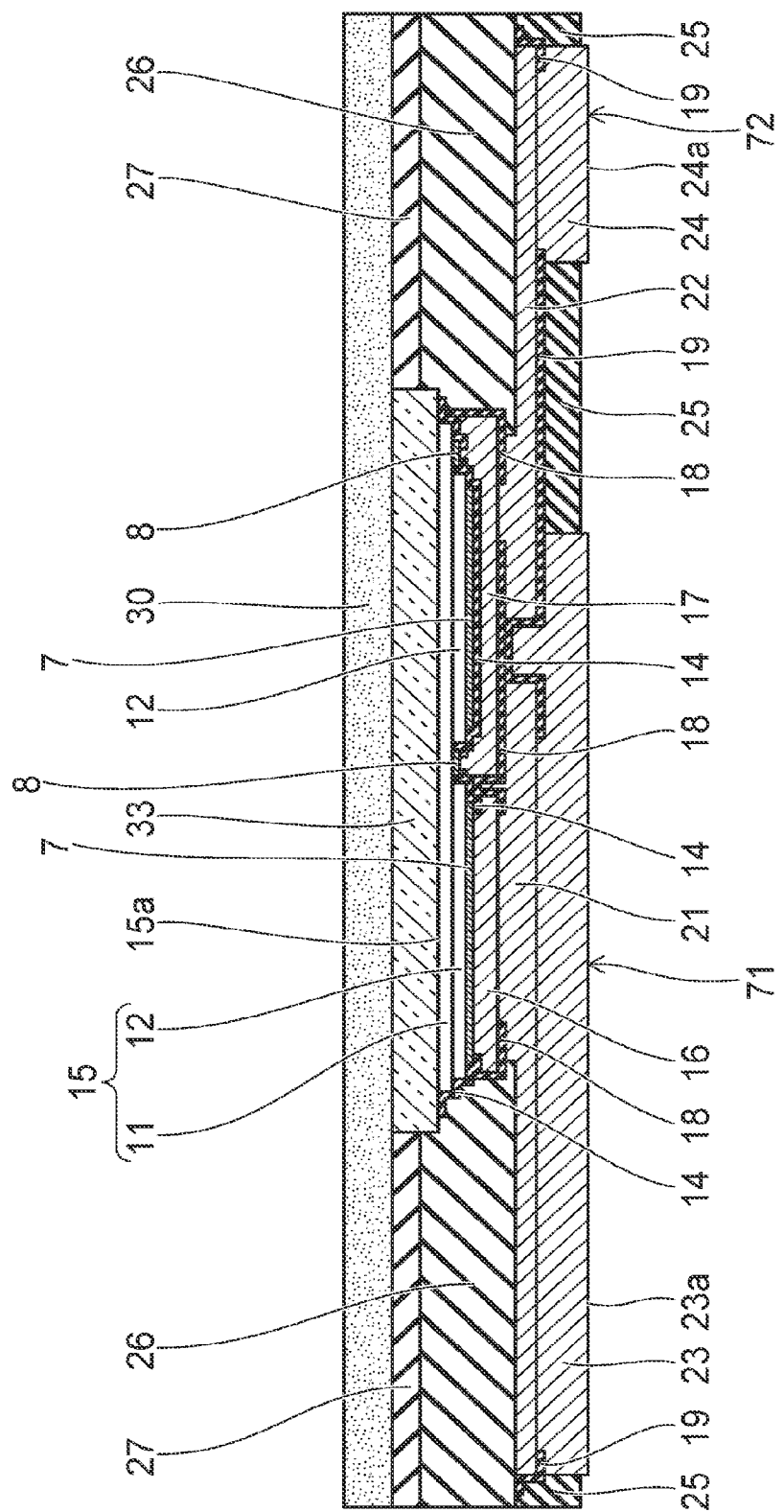

According to the semiconductor light emitting device shown in FIG. 21, the transparent layer 33 is provided on the first surface 15a of the semiconductor layer 15, and the phosphor layer 30 is provided on the transparent layer 33, and the insulating member 27 in the out-of-chip region.

The transparent layer 33 is provided in a region surrounded by the insulating member 27, and the phosphor layer 30 is larger in planar size than the transparent layer 33. In this configuration, the light emitted from the semiconductor layer 15 spreads in the phosphor layer 30 through the transparent layer 33, the light emitting range can be increased compared to FIG. 19 described above. Thus, advantages of an improvement in light conversion efficiency, dispersion and drop of the heat generated by the light conversion in the phosphor layer 30 can be obtained.

Figure 22:
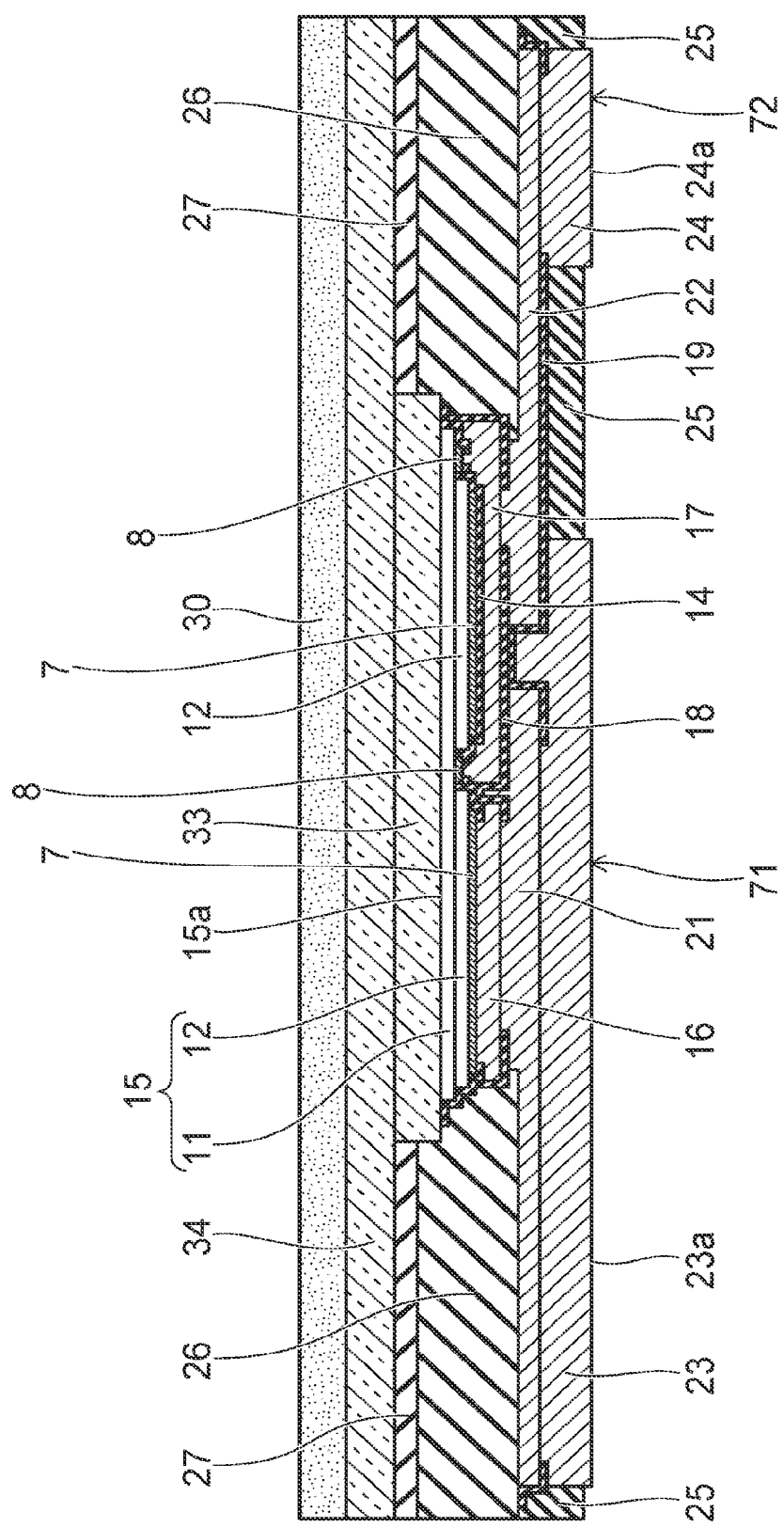

According to the semiconductor light emitting device shown in FIG. 22, a first transparent layer 33 is provided on the first surface 15a of the semiconductor layer 15, and a second transparent layer 34 is provided on the first transparent layer 33, and the insulating member 27 in the out-of-chip region. On the second transparent layer 34, there is provided the phosphor layer 30.

The first transparent layer 33 is provided in a region surrounded by the insulating member 27, and the second transparent layer 34 and the phosphor layer 30 are larger in planar size than the first transparent layer 33. By providing the second transparent layer 34, there is an advantage of further spreading the light emitted from the semiconductor layer 15 compared to the example shown in FIG. 21, and there are further obtained the advantages of the improvement in light conversion efficiency by spreading the light emitting range, and the dispersion and the drop of the heat generated in the phosphor layer 30.

Figure 26:
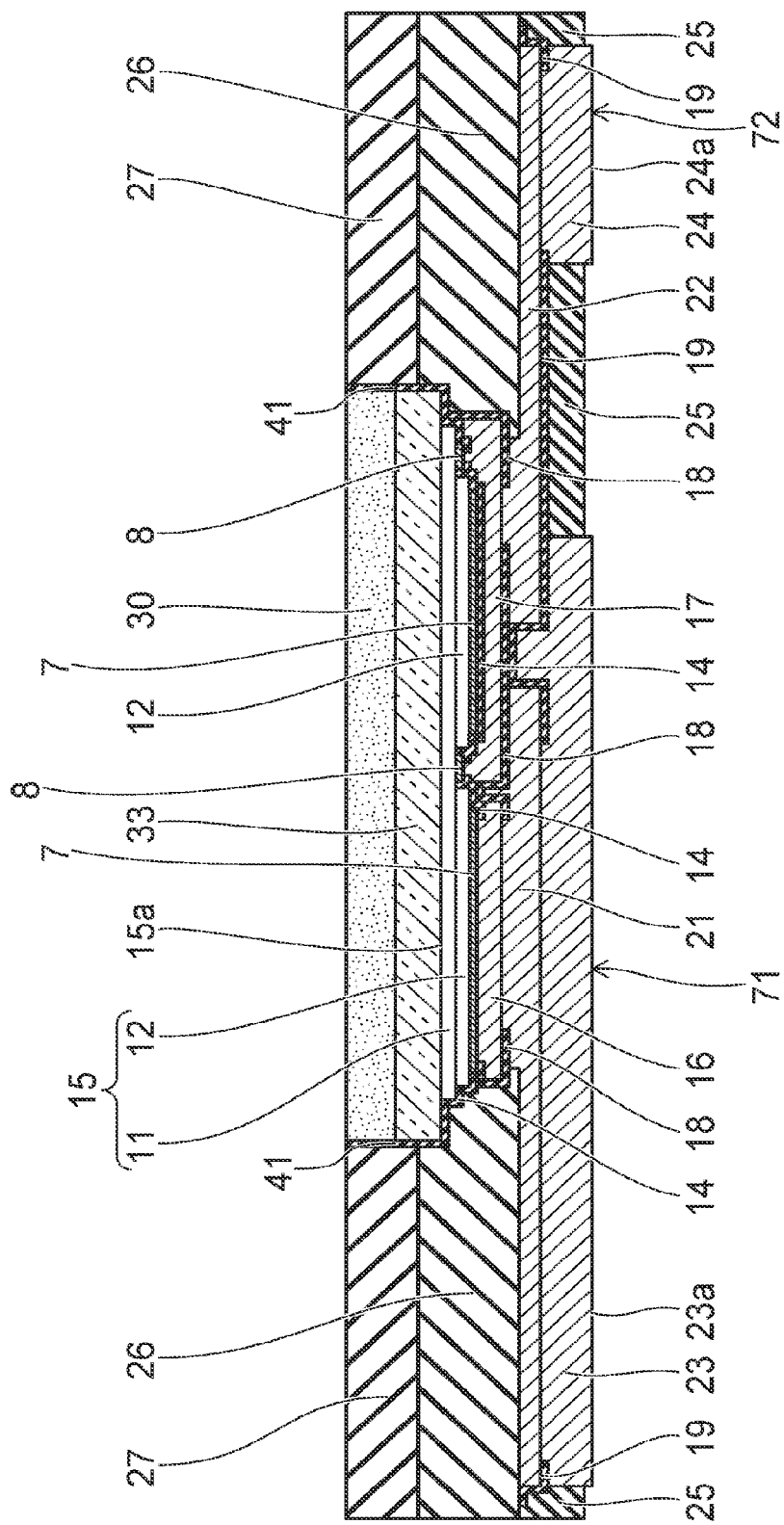
FIG. 26 to FIG. 29 are schematic cross-sectional views of the semiconductor light emitting device of the embodiment.

In the semiconductor light emitting device shown in FIG. 20, the inorganic film 41 can also be provided between the side surface of the phosphor layer 30 and the insulating member 27, between the side surface of the transparent layer 33 and the insulating film 26, and between the side surface of the transparent layer 33 and the insulating member 27 as shown in FIG. 26.

Figure 27:
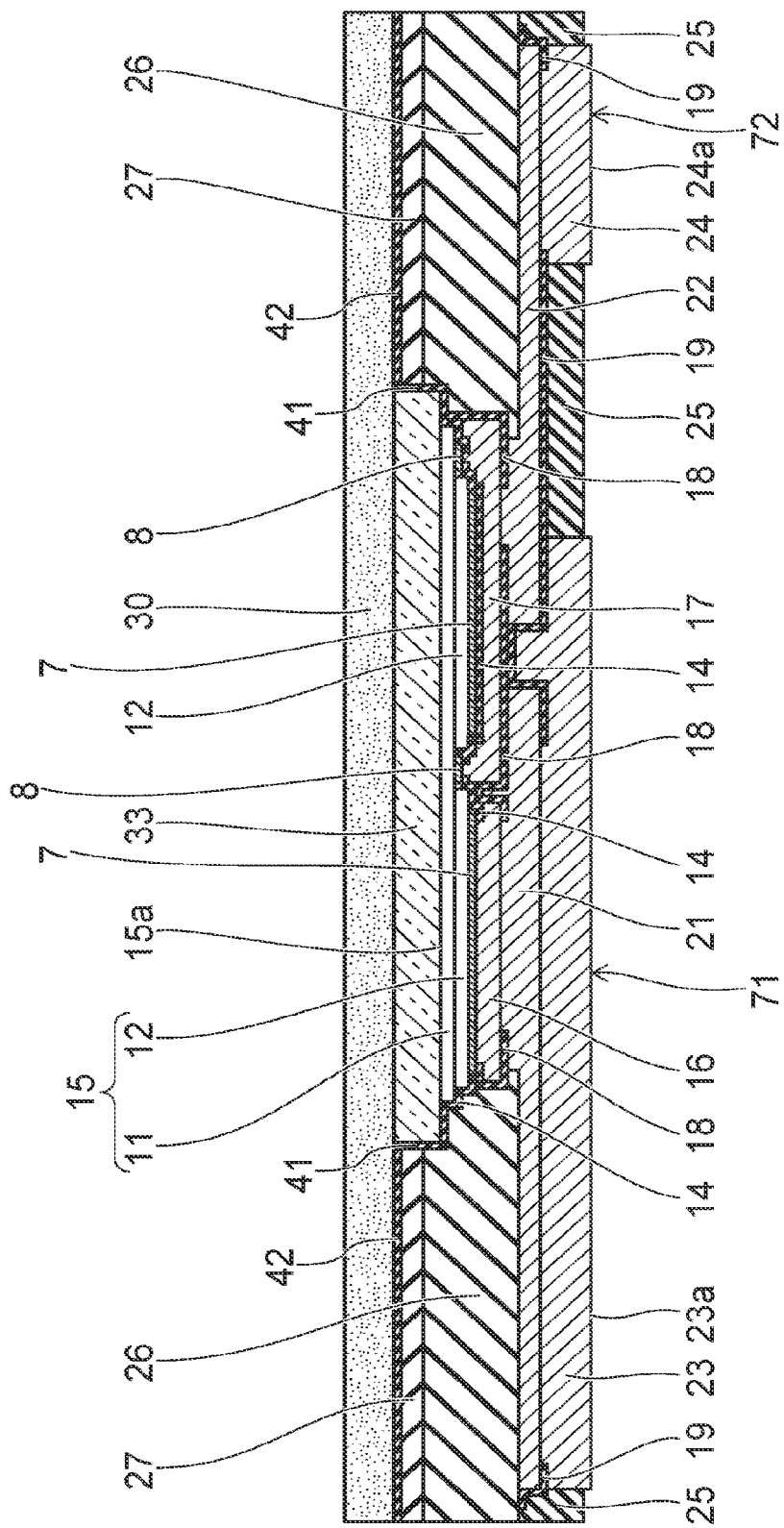

In the semiconductor light emitting device shown in FIG. 21, it is possible to provide the inorganic film 41 between the side surface of the transparent layer 33 and the insulating film 26, and between the side surface of the transparent layer 33 and the insulating member 27, and to provide an inorganic film 42 between the upper surface of the insulating member 27 and the phosphor layer 30 as shown in FIG. 27.

Figure 28:
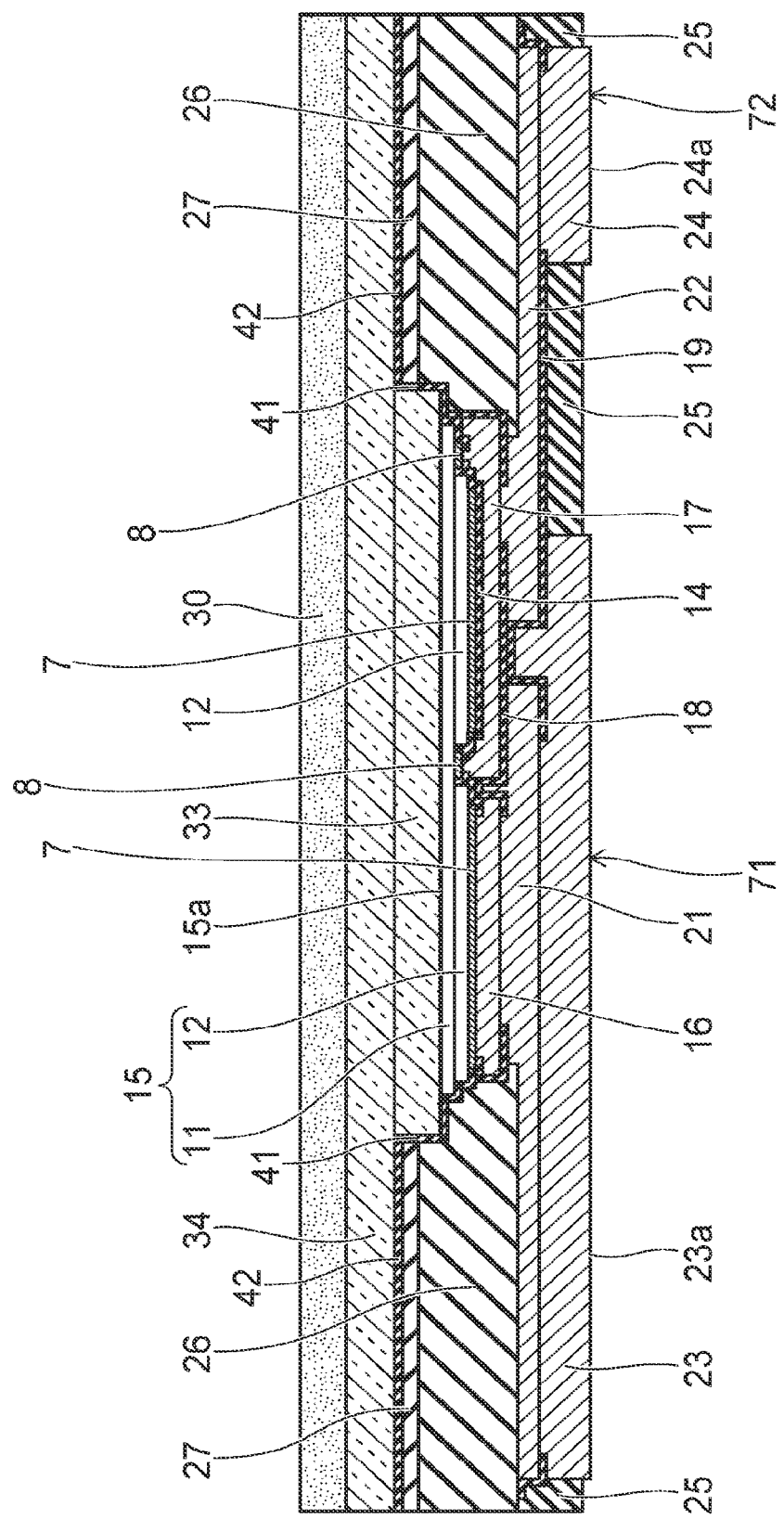

In the semiconductor light emitting device shown in FIG. 22, it is possible to provide the inorganic film 41 between the side surface of the transparent layer 33 and the insulating film 26, and between the side surface of the transparent layer 33 and the insulating member 27, and to provide an inorganic film 42 between the upper surface of the insulating member 27 and the transparent layer 34 as shown in FIG. 28.

Figure 23:
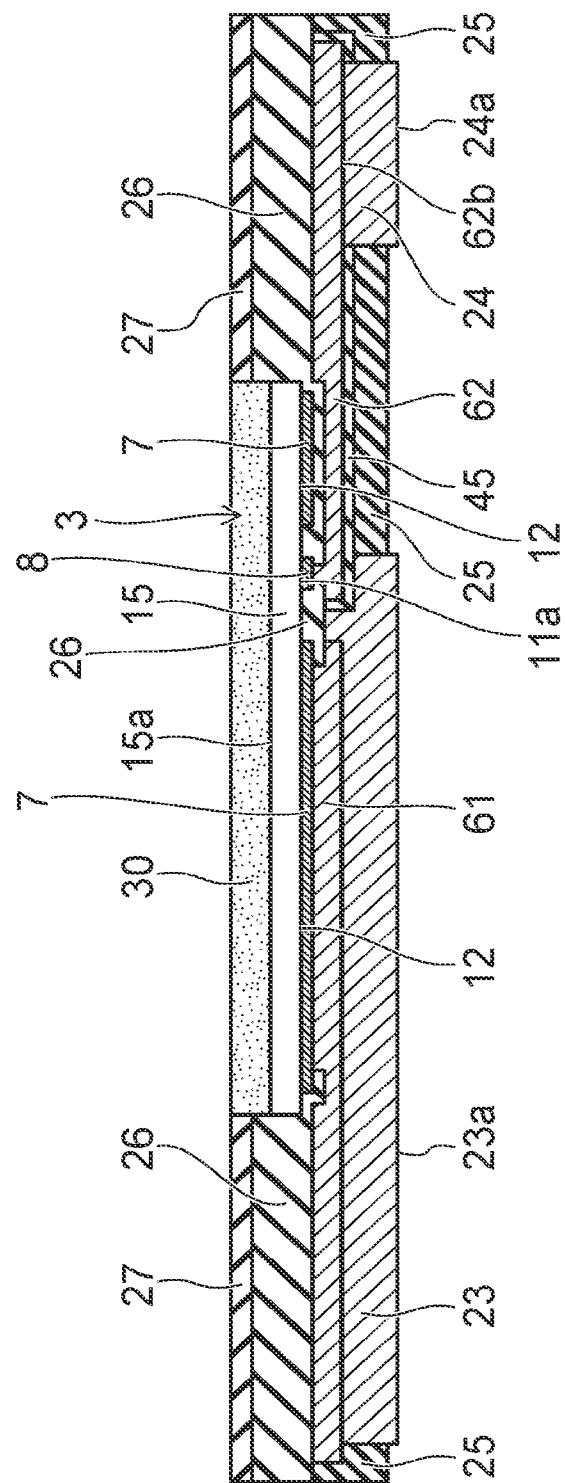

Then, FIG. 23 is a schematic cross-sectional view of a semiconductor light emitting device according to still another embodiment. The same elements as those of the embodiment shown in FIG. 1 are denoted with the same reference symbols, and the detailed explanation thereof will be omitted.

The semiconductor light emitting device shown in FIG. 23 includes the chip 3, the insulating member 27 provided on the periphery of the chip 3, and metal layers 61, 62 provided on the mounting surface side.

As the optical layers such as the phosphor layer, the transparent layer, and the scattering layer, the configuration of the embodiments described above can be applied The semiconductor layer 15 has substantially the same configuration as that of the embodiment described above, and the p-side electrode 7 is provided on the surface of the second layer 12 of the semiconductor layer 15, and the n-side electrode 8 is provided on the second surface 11a of the first layer 11. The p-side electrode 7 and the n-side electrode 8 are provided within a range of a region (a chip region) overlapping the semiconductor layer 15.

The insulating film 26 is formed from the first surface 15a side of the semiconductor layer 15 to the opposite side to the first surface 15a, and the insulating film 26 is provided with an opening for exposing the p-side electrode 7 and an opening for exposing the n-side electrode 8.

On the opposite side to the first surface 15a of the semiconductor layer 15, there are provided the p-side metal layer 61 and the n-side metal layer 62.

The p-side metal layer 61 has contact with the p-side electrode 7 in the region (the chip region) overlapping the semiconductor layer 15 through the opening provided to the insulating film 26, and at the same time, extends integrally from the contact portion having contact with the p-side electrode 7 to the out-of-chip region. The p-side metal layer 61 is electrically connected to the second layer 12 via the p-side electrode 7, and does not contact with the first layer 11. The p-side metal layer 61 is integrally provided so as to overlap each of the semiconductor layer 15 and the insulating member 27.

The n-side metal layer 62 has contact with the n-side electrode 8 in the region (the chip region) overlapping the semiconductor layer 15 through the opening provided to the insulating film 26, and at the same time, extends integrally from the contact portion having contact with the n-side electrode 8 to the out-of-chip region. The n-side metal layer 62 is electrically connected to the first layer 11 via the n-side electrode 8. The insulating film 26 is provided between the n-side metal layer 62 and the p-side electrode 7, and between the n-side metal layer 62 and the second layer 12, and the n-side metal layer 62 is not in contact with the p-side electrode 7 and the second layer 12. The n-side metal layer 62 is integrally provided so as to overlap each of the semiconductor layer 15 and the insulating member 27.

The area of the contact surface between the p-side electrode 7 and the p-side metal layer 61 is larger than the area of the contact surface between the n-side electrode 8 and the n-side metal layer 62. The area of the p-side metal layer 61 is larger than the area of the n-side metal layer 62.

In an out-of-chip region located outside the side surface of the semiconductor layer 15, there is provided an insulating member 27. The insulating member 27 is only provided on the first surface side of the semiconductor layer 15, and is provided on the periphery of the phosphor layer 30.

A part of the p-side metal layer 61 extending to the out-of-chip region is supported by the insulating member 27 via the insulating film 26. A part of the n-side metal layer 62 extending to the out-of-chip region is supported by the insulating member 27 via the insulating film 26.

The p-side external connection electrode 23 is provided on the p-side metal layer 61. The p-side external connection electrode 23 has contact with the p-side metal layer 61, and is electrically connected to the p-side metal layer 61. The thickness of the p-side external connection electrode 23 is greater than the thickness of the p-side metal layer 61.

The insulating film 45 is provided on the surface of the n-side metal layer 62. The insulating film 45 is, for example, an inorganic film such as a silicon oxide film.

The insulating film 45 is provided with an opening for exposing the n-side pad 62b of the n-side metal layer 62. On the n-side pad 62b, there is provided an n-side external connection electrode 24. The n-side external connection electrode 24 is provided in the out-of-chip region, and has contact with the n-side pad 62b of the n-side metal layer 62, and is electrically connected to the n-side metal layer 62. The thickness of the n-side external connection electrode 24 is greater than the thickness of the n-side metal layer 62.

The resin layer 25 is provided between the p-side external connection electrode 23 and the n-side external connection electrode 24. A space between the p-side external connection electrode 23 and the n-side external connection electrode 24 is filled with a resin layer 25 so that the resin layer 25 has contact with the side surface of the p-side external connection electrode 23 and the side surface of the n-side external connection electrode 24.

Further, the resin layer 25 is provided on the side surface of the p-side external connection electrode 23 and the side surface of the n-side external connection electrode 24, and covers the side surface of the p-side external connection electrode 23 and the side surface of the n-side external connection electrode 24. The resin layer 25 is also provided on the side surface of the p-side metal layer 61 and the side surface of the n-side metal layer 62, and covers the side surface of the p-side metal layer 61 and the side surface of the n-side metal layer 62.

The lower surface of the p-side external connection electrode 23 is exposed from the resin layer 25, and functions as the p-side mounting surface (the p-side external terminal) 23a connectable to an external circuit on a mounting board or the like. The lower surface of the n-side external connection electrode 24 is exposed from the resin layer 25, and functions as the n-side mounting surface (the n-side external terminal) 24a connectable to an external circuit on the mounting board or the like. The p-side mounting surface 23a and the n-side mounting surface 24a are bonded to a land pattern on the mounting board via, for example, solder or an electrically-conductive bonding material.

The p-side mounting surface 23a and the n-side mounting surface 24a are arranged asymmetrically about the center line c dividing the planar region of the semiconductor layer 15 into two equal parts, and the area of the p-side mounting surface 23a is larger than the area of the n-side mounting surface 24a.

The contact area between the n-side pad 62b of the n-side metal layer 62 and the n-side external connection electrode 24 is larger than the contact area between the n-side electrode 8 and the n-side metal layer 62. The n-side electrode contact surface (the second surface 11a of the first layer 11) in the semiconductor layer 15 is relocated to a larger region by the n-side metal layer 62. Thus, it becomes possible to decrease the area of the n-side electrode surface in the semiconductor layer 15 while ensuring the area of the n-side mounting surface 24a sufficient for reliable mounting. Therefore, it becomes possible to reduce the area of the regions of the semiconductor 15, which does not include the light emitting layer 13, to increase the area of the region including the light emitting layer 13 to thereby improve the light output.

The semiconductor layer 15 is supported on a support body formed of a composite body of the metal layers 61, 62, the external connection electrodes 23, 24, and the resin layer 25. Further, the semiconductor layer 15 is supported from the side surface side by the insulating film 26 as, for example, a resin layer thicker than the semiconductor layer 15.

As the material of the metal layers 61, 62 and the external connection electrodes 23, 24, for example, copper, gold, nickel, and silver can be used. Among these materials, by using copper, good thermal conductivity, and high migration resistance can be obtained, and adhesiveness to the insulating material can be improved.

By forming the p-side external connection electrode 23, the n-side external connection electrode 24, and the resin layer 25 to have appropriate thickness (height), it is possible for the p-side external connection electrode 23, the n-side external connection electrode 24, and the resin layer 25 to absorb and relax the stress applied when mounting. In particular, by using the resin layer 25 more flexible than the semiconductor layer 15 on the mounting surface side as a part of the support body, the stress relaxation effect can be enhanced.

Further, the insulating member 27 is not provided on the side surface of the semiconductor layer 15. In other words, by providing the insulating film 26 on the side surface of the semiconductor layer 15, it is possible to enlarge a part for absorbing and relaxing such stress when mounting. In particular, by using the insulating film 26 more flexible than the semiconductor layer 15 as a part of the support body, it becomes possible to further enhance the stress relaxation effect.

The metal layers 61, 62 and the external connection electrodes 23, 24 each include, for example, copper having high thermal conductivity as a principal component, and the highly thermal conductive body spreads in the region overlapping the light emitting layer 13 with a large area. The heat generated in the light emitting layer 13 is released to the mounting board with a short path formed below the chip through the metal layers 61, 62 and the external connection electrodes 23, 24.

In particular, since the p-side mounting surface 23a connected to the light emitting region of the semiconductor layer 15 overlaps most part of the planar region of the semiconductor layer 15, it is possible to release the heat to the mounting board with high efficiency through the p-side metal layer 61 and the p-side external connection electrode 23.

Further, according to the embodiment, the p-side mounting surface 23a also expands to the out-of-chip region. Therefore, the planar size of the solder bonded to the p-side mounting surface 23a can also be increased, and thus, the heat radiation property to the mounting board via the solder can be enhanced.

Further, the n-side metal layer 62 extends to the out-of-chip region. Therefore, it is possible to provide the n-side mounting surface 24a in the out-of-chip region without being subject to the restriction of the p-side mounting surface 23a arranged so as to constitute a large part of the region overlapping the chip. By arranging the n-side mounting surface 24a in the out-of-chip region, it is possible to increase the area compared to the case of arranging the n-side mounting surface 24a only within a range of the chip region.

In addition to the above, since the insulating member 27 is not provided nearer to the mounting surface than the first surface 15a, the freedom of layout of the n-side interconnect layer 22 is enhanced.

Therefore, regarding the n-side, the planar size of the solder bonded to the n-side mounting surface 24a can also be increased, and thus, the heat radiation property to the mounting board via the solder can be enhanced.

The p-side metal layer 61 is integrally and immediately laterally extracted from a part (an on-chip part) having contact with the p-side electrode 7, and extends to the out-of-chip region. The n-side metal layer 62 is immediately laterally extracted from a part (an on-chip part) having contact with the n-side electrode 8, and extends to the out-of-chip region. Therefore, it is possible to efficiently release the heat of the semiconductor layer 15 to the mounting board via the large mounting surface.

Further, the phosphor layer 30 is formed in a wafer-level process, but is not formed on the side surface of the semiconductor layer 15 so as to wrap around the side surface thereof toward the mounting surface. Therefore, the phosphor layer 30 is not uselessly formed on the chip side surface and the mounting surface side from which the light is not extracted, and thus, the cost reduction can be achieved.

Further, in the state in which mounting is not performed as shown in FIG. 23, a resin layer 25 different from the phosphor layer 30 is provided on the periphery of the p-side external connection electrode 23 and the periphery of the n-side external connection electrode 24, and thus, the characteristic suitable for stress relaxation can be provided to the mounting surface side. Further, since the resin layer 25 has already been provided on the mounting surface side, the underfill after mounting becomes unnecessary.

On the first surface 15a side of the semiconductor layer 15, there is provided the optical layer designed so as to give priority to the light extraction efficiency, the color conversion efficiency, the light distribution characteristic, and so on, and on the mounting surface side, there is provided the layer giving priority to the stress relaxation when mounting, and the characteristic as a support body instead of the substrate. For example, the resin layer 25 has a structure obtained by densely filling the resin to be the base with a filler such as silica particles, and is adjusted to have an appropriate hardness as the support body.

According to the embodiment explained hereinabove, the semiconductor layer 15 and the optical layer are formed in a lump wafer by wafer to realize the low-cost chip-size device 3, and at the same time, the metal layers 61, 62 and the external terminals (the mounting surface) 23a, 34a are expanded to the out-of-chip region, and thus, the heat radiation property can be improved. Therefore, a semiconductor device low in price and high in reliability can be provided.

Further, by providing the insulating member 27 only in an area nearer to the optical layer than the first surface 15a of the semiconductor layer 15, the stress relaxation effect can be enhanced, and it is possible to provide the semiconductor light emitting device superior in stress relaxation property.

Figure 24:
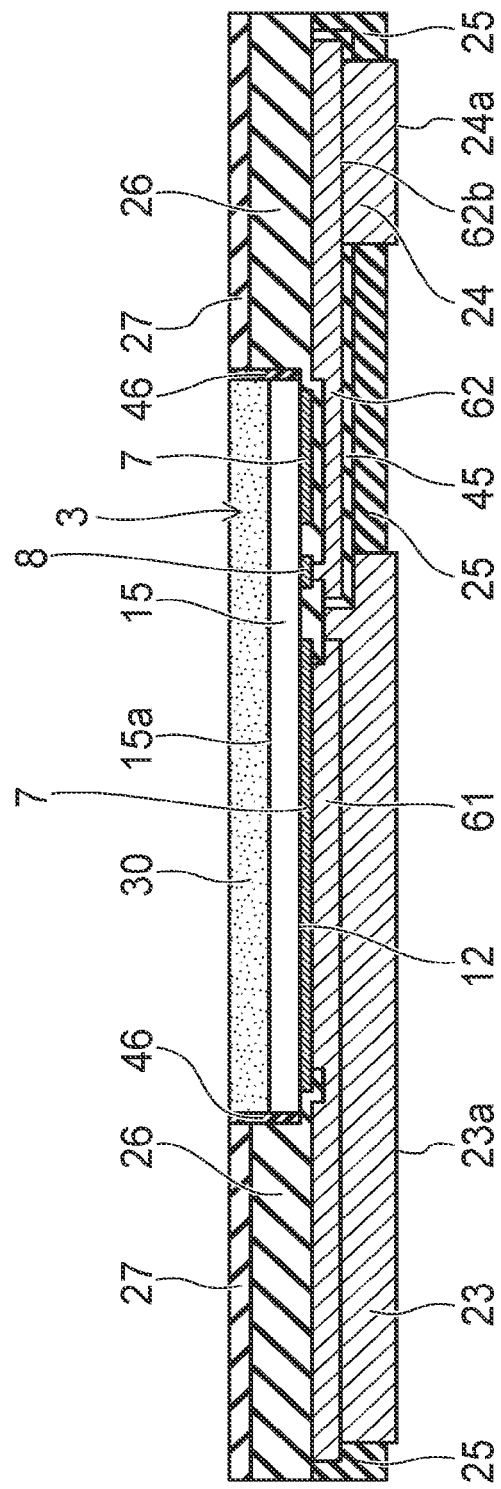

Further, according to a semiconductor light emitting device shown in FIG. 24, in the device shown in FIG. 23, an inorganic film 46 is provided between the side surface of the semiconductor layer 15 and the insulating film 26, between the phosphor layer 30 and the insulating film 26, and between the side surface of the phosphor layer 30 and the insulating member 27.

The inorganic film 46 is, for example, a silicon oxide film, and enhances the adhesiveness between the semiconductor layer 15 and the insulating film 26, the adhesiveness between the phosphor layer 30 and the insulating film 26, and the adhesiveness between the phosphor layer 30 and the insulating member 27.

In the structure in which the phosphor layer is provided on the semiconductor layer including the light emitting layer, and a transparent layer is provided on the phosphor layer, the heat due to the light emission in the light emitting layer and the phosphor layer transfers to the transparent layer. It is difficult to improve the heat resistance of the transparent layer using, for example, the resin material, and the heat is apt to be accumulated in the transparent layer. In some cases, it is possible that the transparent layer is deteriorated by heat, and thus the light emission characteristics of the semiconductor light emitting device are deteriorated. In particular, in the semiconductor light emitting device with high light output, the deterioration of the transparent layer due to the heat can be a problem.

Figure 29:
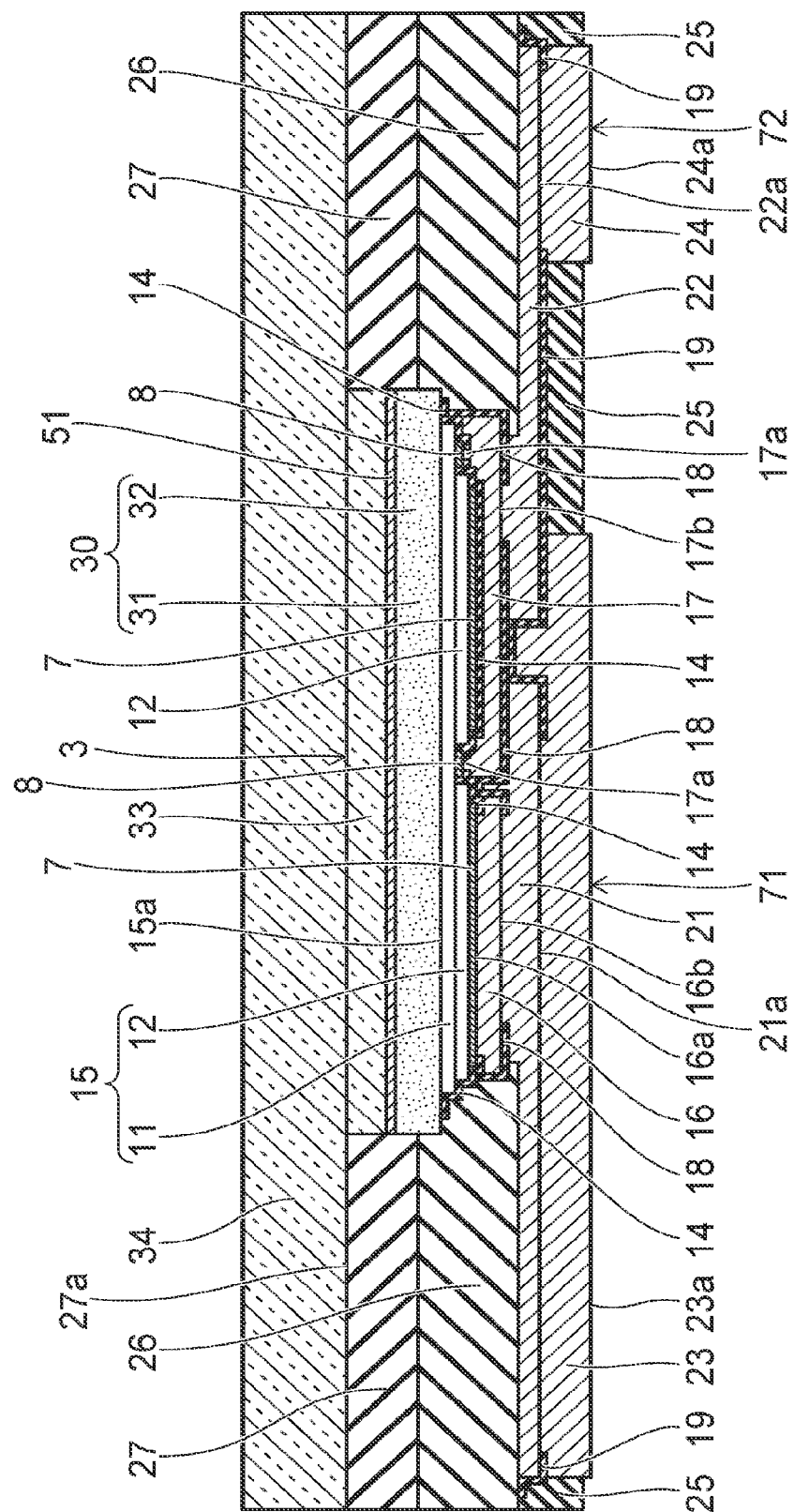

Therefore, according to the embodiment shown in FIG. 29, a heat-insulating layer 51 is provided between the phosphor layer 30 and the transparent layer 33. The heat-insulating layer 51 has permeability with respect to the light emitted by the light emitting layer 13 and the light emitted by the phosphor particles 31.

A silicon oxide film ($SiO_2$ film) low in heat transfer coefficient and high in light permeability is formed as the heat-insulating layer 51 using, for example, a sputtering method.

Figure 30A:
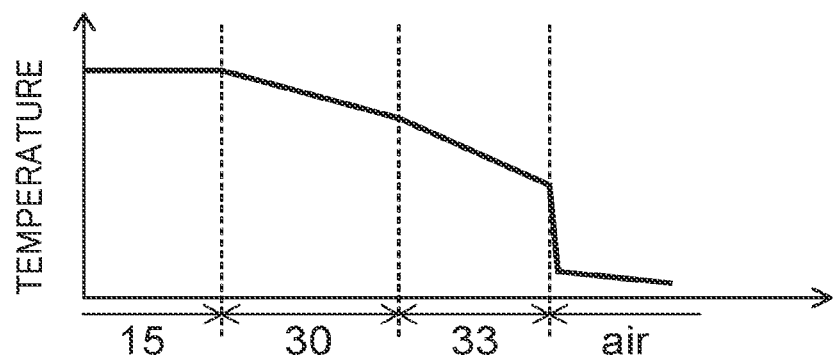
FIGS. 30A and 30B are temperature profiles of the semiconductor light emitting device of the embodiment.

FIG. 30A shows an example of a temperature profile of the layers in the structure not provided with the heat-insulating layer 51.

Figure 30B:
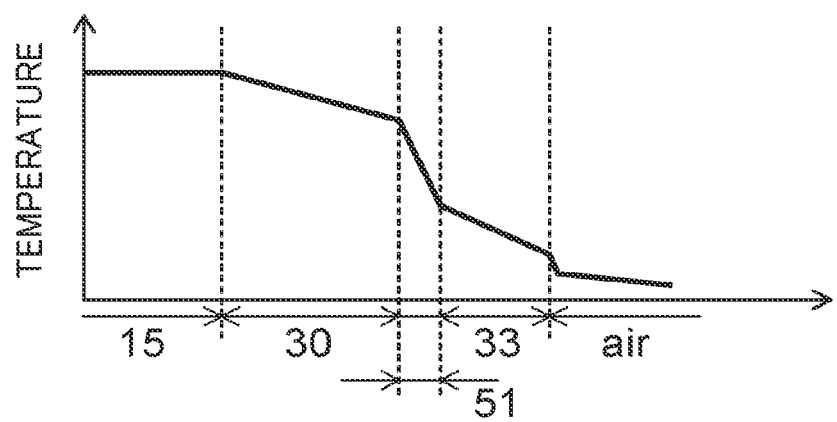

FIG. 30B shows an example of a temperature profile of the layers in the structure provided with the heat-insulating layer 51 provided between the phosphor layer 30 and the transparent layer 33.

In comparison between FIGS. 30A and 30B, by providing the heat-insulating layer 51, the heat from the semiconductor layer 15 and the phosphor layer 30 becomes difficult to transfer to the transparent layer 33. As a result, rise in temperature of the transparent layer 33 is suppressed, and thus, the thermal deterioration of the transparent layer 33 can be prevented. The structure provided with the heat-insulating layer 51 is particularly suitable for the high output semiconductor light emitting device.

The forming method of the heat-insulating layer 51 is not limited to the sputtering method, but vapor deposition method, a plating method, a coating method, and a sol-gel method can be used for example.

Further, the material of the heat-insulating layer 51 is not limited to $SiO_2$, it is possible to use a variety of oxides, nitrides, heat resistant resin, and so on having high light permeability and low heat transfer coefficient (e.g., the heat transfer coefficient equal to or lower than 30 $W/(m^2K)$). For example, as the material of the heat-insulating layer 51, there can be used $SrTiO_3$, $MgO$, $ZrO_2$, and YSZ (yttria-stabilized zirconia). Further, the heat-insulating layer 51 can also have a porous structure.

Figure 31:
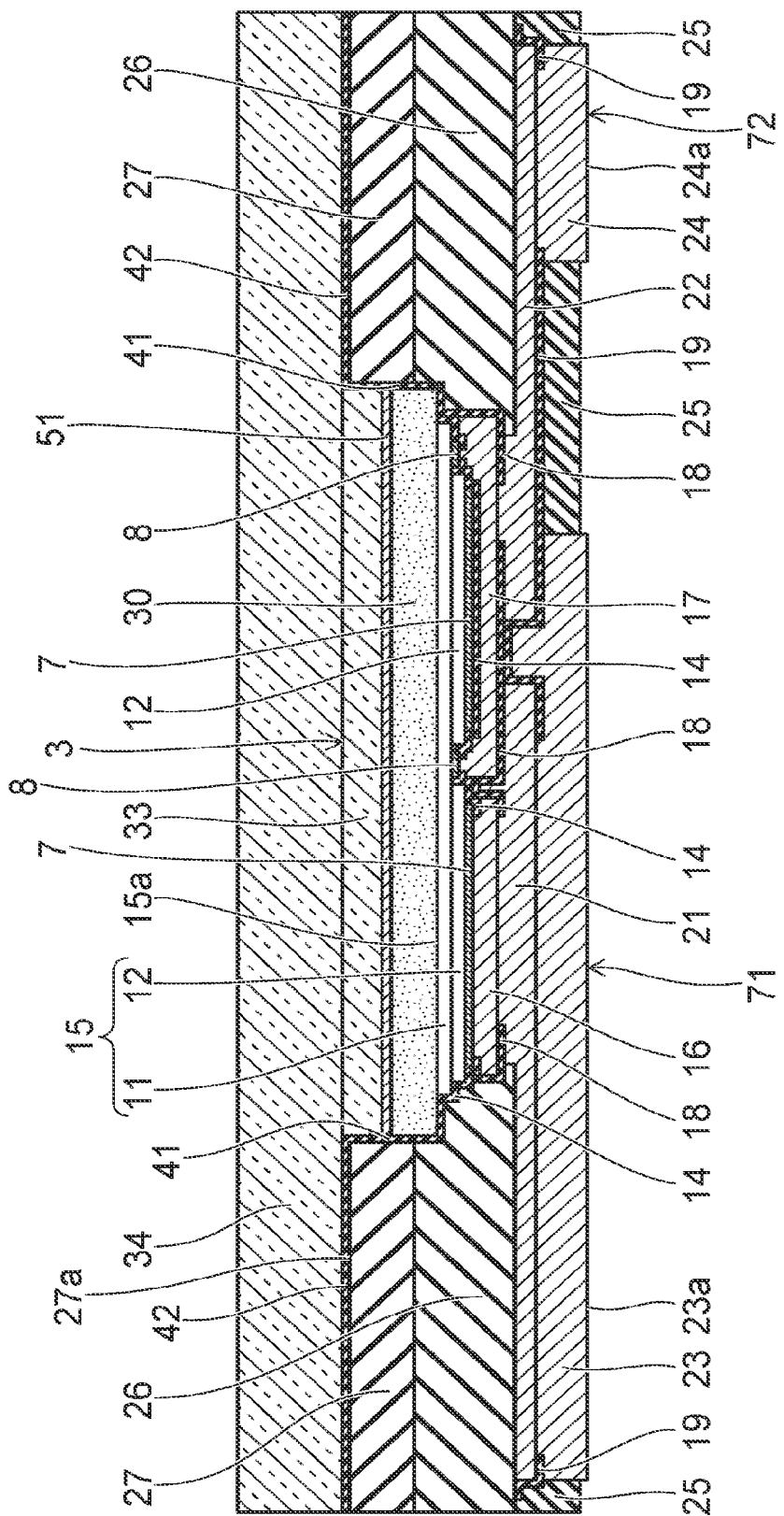
FIG. 31 to FIG. 35B are schematic cross-sectional views of the semiconductor light emitting device of the embodiment.

In the structure shown in FIG. 19, it is also possible to provide the heat-insulating layer 51 between the phosphor layer 30 and the transparent layer 33 as shown in FIG. 31.

The length of the path the light (the excitation light) of the light emitting layer 13 proceeds obliquely through the phosphor layer 30 is longer than the length of the path the excitation light proceeds in the thickness direction through the phosphor layer 30, and the excitation light obliquely proceeding through the phosphor layer 30 excites the larger number of phosphor particles 31 compared to the excitation light proceeding in the thickness direction through the phosphor layer 30.

Therefore, among the light emitted from the phosphor layer 30, the larger the emission angle is, the more strongly the emission color (e.g., a yellow tinge) of the phosphor particles 31 is taken on. When viewing the light extraction surface (the upper surface in FIG. 1) of the semiconductor light emitting device from an oblique direction, the light taking on a strong yellow tinge, for example, is apt to be observed compared to the case of viewing the surface from directly above. In other words, in some cases, there occurs the color breakup, in which the color of the light varies in accordance with the angle at which the semiconductor light emitting device is viewed.

In the embodiments shown in FIGS. 1, 19, 29, and 31 described above, the phosphor layer 30 is provided in the region surrounded by the insulating member 27, and the upper end of the side surface adjacent to the phosphor layer 30 in the insulating member 27 projects from the upper surface of the phosphor layer 30. A step is formed between the upper surface 27a of the insulating member 27 and the upper surface of the phosphor layer 30. The insulating member 27 surrounds the periphery of the phosphor layer 30, and further, a region surrounded by the insulating member 27 is also formed above the phosphor layer 30.

Further, as described above, a part in the insulating member 27 adjacent to the side surface of the phosphor layer 30, and a part adjacent to the side surface of the transparent layer 33 have reflectivity with respect to the radiation light of the light emitting layer 13 and the radiation light of the phosphor particles 31.

Therefore, according to the embodiment, a part of the light obliquely emitted from the phosphor layer 30 proceeds toward the side surface of the insulating member 27, and is reflected by the side surface of the insulating member 27 as schematically indicated with the arrows in FIG. 1.

Therefore, it is possible to reflect or scatter the light, which is large in emission angle, and has a strong yellow tinge, and is emitted from the phosphor layer 30, toward the direction with a small emission angle, and thus, the color breakup can be suppressed.

Figure 32:
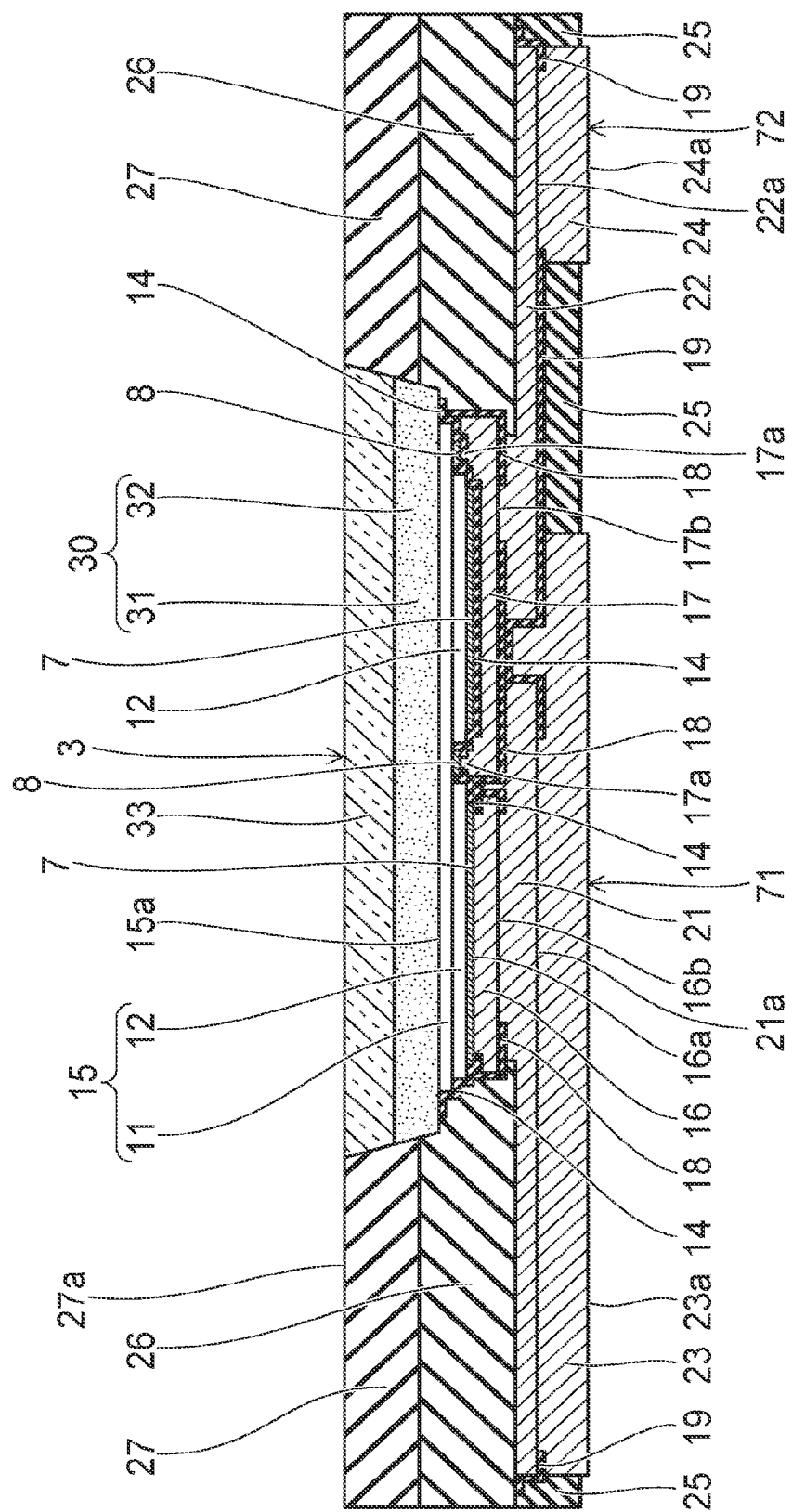

The side surface of the insulating member 27 surrounding the periphery of the side surface of the optical layer (the phosphor layer 30, the transparent layer 33) is not limited to being perpendicular to the light emission surface (the first surface 15a of the semiconductor layer 15, or the upper surface of the phosphor layer 30), but can also be tilted as shown in FIG. 32.

In the example shown in FIG. 32, the width of the region surrounded by the side surface of the insulating member 27 continuously increases from the lower part on the semiconductor layer 15 side toward the upper part. The upper surface and the side surface of the insulating member 27 form an obtuse angle. It is also possible for the width of the region surrounded by the side surface of the insulating member 27 to gradually increase from the lower part on the semiconductor layer 15 side toward the upper part.

By tilting the side surface of the insulating member 27 surrounding the periphery of the optical layer, an increase in light distribution angle becomes possible compared to the vertical side surface.

Figure 33:
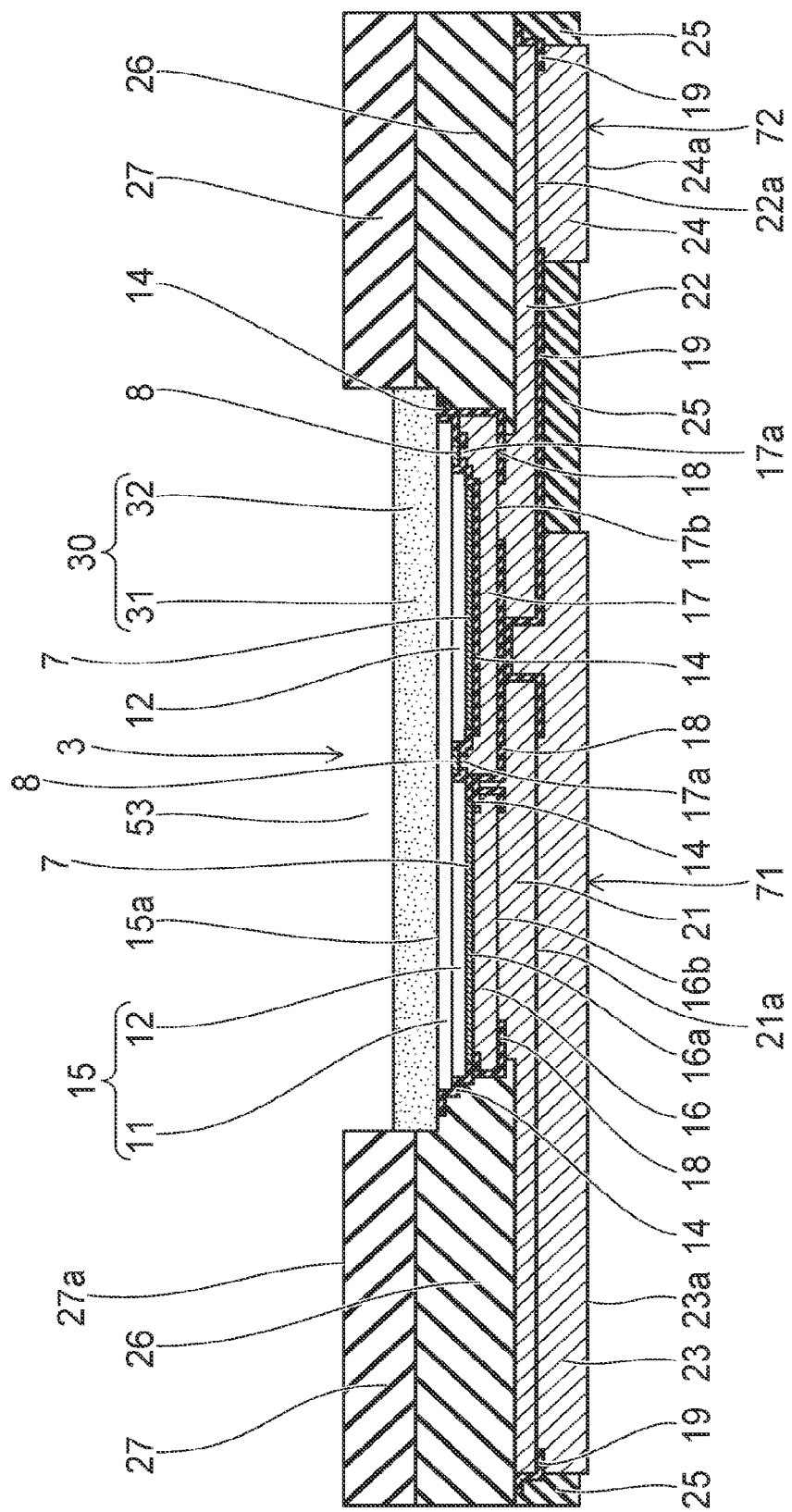

As shown in FIG. 33, it is also possible to provide a space 53 surrounded by the side surface of the insulating member 27 on the phosphor layer 30 instead of providing the transparent layer on the phosphor layer 30. According also to this structure, it is possible to reflect the oblique light emitted from the phosphor layer 30 with the side surface of the insulating member 27.

Figure 34:
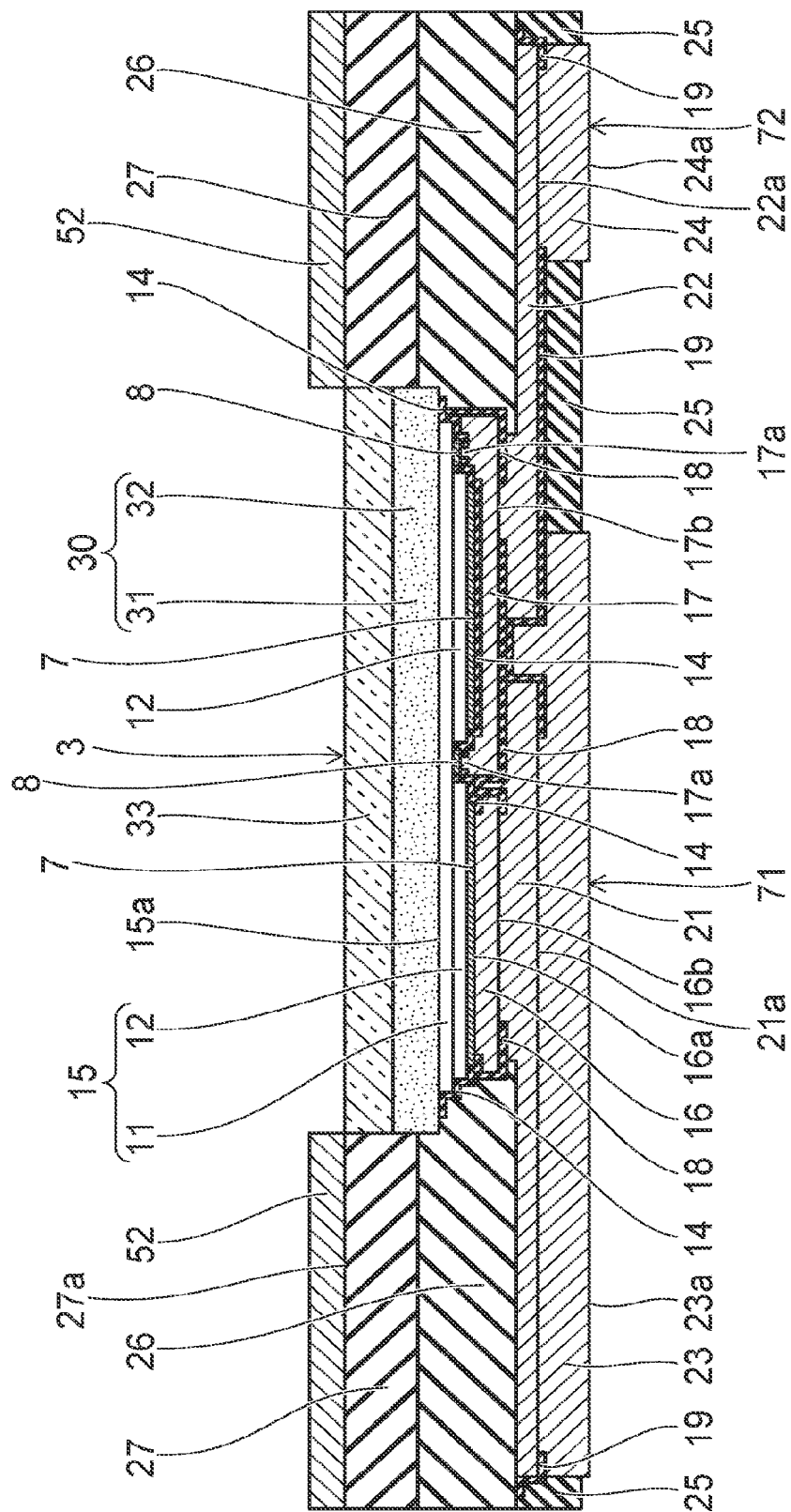

As shown in FIG. 34, a reflecting layer 52 separated from the insulating member 27 can also be provided on the upper surface of the insulating member 27.

The reflecting layer 52 is, for example, an aluminum (Al) layer or a scattering layer including a light scattering material. The oblique light emitted from the phosphor layer 30 can also be reflected by the reflecting layer 52.

As shown in FIGS. 1, 19, 23, 24, 29, 31, 32, 33, and 34, the structure in which the transparent layer is not made to intervene between the semiconductor layer 15 and the phosphor layer 30 is easy to release the heat of the phosphor layer 30 to the mounting board through the semiconductor layer and the metal located under the semiconductor layer 15. Therefore, the rise in temperature of the phosphor layer 30 can be suppressed.

The structure shown in FIGS. 23 and 24 only have the single optical layer (the phosphor layer 30) stacked on the semiconductor layer 15, and is therefore low in cost.

As shown in FIGS. 1, 19, 29, 31, 32, and 34, in the structure having the transparent layer 33, 34 provided on the phosphor layer 30, by setting the refractive index of the transparent layer to an intermediate value between the refractive index of the transparent layer (the binder 32) of the phosphor layer 30 and the refractive index of air, the light extraction efficiency can be improved.

As shown in FIGS. 20, 21, 22, 26, 27, and 28, in the structure having the transparent layer 33, 34 provided between the semiconductor layer 15 and the phosphor layer 30, by setting the refractive index of the transparent layer 33, 34 to an intermediate value between the refractive index of the semiconductor layer (e.g., GaN) 15 and the refractive index of the transparent layer of the phosphor layer 30, the extraction efficiency of the light from the semiconductor layer 15 can be improved. Further, the return light from the phosphor layer 30 to the semiconductor layer 15 can be decreased.

As shown in FIGS. 21, 22, 27, and 28, in the structure having the phosphor layer 30 also provided on the upper surface 27a of the insulating member 27 on the periphery of the chip 3, the excitation light emission area can be enlarged. Therefore, the light conversion efficiency can be improved, and the heat of the phosphor layer 30 can be dispersed.

As shown in FIGS. 22, 28, in the structure having the transparent layer 34 provided on the upper surface 27a of the insulating member 27 on the periphery of the chip 3, and having the phosphor layer 30 provided on the transparent layer 34, the light spreads in the horizontal direction through the transparent layer 34 spreading on the entire surface of the package. Further, the reflected light from the phosphor layer 30 is reflected again by the insulating member 27, and spreads in the horizontal direction through the transparent layer 34. Therefore, the light conversion efficiency is further improved. Further, by providing the scattering property to the transparent layer 34, the light conversion efficiency is further improved.

In each of the embodiments explained hereinabove, it is also possible to leave, for example, the sapphire substrate, which has been used for the epitaxial growth of the semiconductor layer 15, on the first surface 15a as the transparent layer. Further, the material of the transparent layer is not limited to the resin material, but a crystalline body or glass can also be used. Further, it is also possible for the transparent layer to have a function as a collecting lens or a diffusing lens besides the light scattering function.

According to each of the embodiments described above, a semiconductor light emitting device superior in stress relaxation can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor light emitting device comprising:
   a semiconductor layer having a first layer including an n-type semiconductor, a second layer including a p-type semiconductor, a light emitting layer provided between the first layer and the second layer, a first surface, and a second surface opposite to the first surface;
   an n-side electrode provided on the semiconductor layer;
   a p-side electrode provided on the semiconductor layer;
   a third layer provided on the first surface and having light transparency;
   an insulating member having a lower surface, an elevation of the lower surface being higher than an elevation of the first surface, the insulating member covering a periphery of the third layer, and having light reflectivity on at least a surface of a part of the insulating member adjacent to a side surface of the third layer;
   an n-side metal portion being in contact with the n-side electrode, and extending toward a region overlapping the insulating member, the n-side metal portion including an n-side external terminal, the n-side external terminal overlapping the insulating member; and
   a p-side metal portion being in contact with the p-side electrode, and extending toward a region overlapping the insulating member, the p-side metal portion includes a p-side external terminal, the p-side external terminal overlapping the insulating member.

2. The device according to claim 1, further comprising:
   an insulating film provided between the insulating member and the n-side metal portion, and between the insulating member and the p-side metal portion, wherein
   a Young's modulus of the insulating film is lower than a Young's modulus of the insulating member.

3. The device according to claim 2, wherein
   the insulating film is in contact with each of the insulating member, the n-side metal portion, and the p-side metal portion.

4. The device according to claim 2, wherein
   the insulating film covers the side surface of the third layer and a side surface of the semiconductor layer.

5. The device according to claim 2, wherein
   a corner of the third layer on the semiconductor layer side is covered with the insulating film instead of the insulating member.

6. The device according to claim 1, further comprising:
   a resin layer provided between the n-side external terminal and the p-side external terminal.

7. The device according to claim 6, wherein
   the resin layer is provided on a periphery of the n-side metal portion and a periphery of the p-side metal portion.

8. The device according to claim 7, wherein
   a corner of the third layer on the semiconductor layer side is covered via the insulating film with at least either one of the n-side metal portion and the p-side metal portion.

9. The device according to claim 1, wherein
   an area of a lower surface of the p-side external terminal is larger than an area of a lower surface of the n-side external terminal.

10. The device according to claim 1, further comprising:
    a fourth layer provided on the third layer and having light transparency.

11. The device according to claim 10, further comprising:
    a fifth layer provided on the fourth layer and the insulating member, the fifth layer having light transparency.

12. The device according to claim 1, further comprising:
    a reflecting layer provided between the insulating member and the third layer.

13. A semiconductor light emitting device comprising:
    a semiconductor layer having a first layer including an n-type semiconductor, a second layer including a p-type semiconductor, a light emitting layer provided between the first layer and the second layer, a first surface, and a second surface opposite to the first surface;
    an n-side electrode provided on the semiconductor layer;
    a p-side electrode provided on the semiconductor layer;
    a third layer provided on the first surface and having light transparency;
    an insulating member having a lower surface, an elevation of the lower surface being higher than an elevation of the first surface, the insulating member covering a periphery of the third layer;
    an n-side metal portion being in contact with the n-side electrode, and extending toward a region overlapping the insulating member;
    a p-side metal portion being in contact with the p-side electrode, and extending toward a region overlapping the insulating member; and
    an insulating film provided between the insulating member and the n-side metal portion, and between the insulating member and the p-side metal portion, a Young's modulus of the insulating film being lower than a Young's modulus of the insulating member.

14. The device according to claim 13, wherein the insulating member has light reflectivity on at least a surface of a part adjacent to a side surface of the third layer.

15. A method of manufacturing semiconductor light emitting device, comprising:
    embedding a plurality of singulated semiconductor layer chips and a part of a third layer into a support body, the third layer having transparency, the semiconductor layer chips including
      a semiconductor layer including a first layer including an n-type semiconductor, a second layer including a p-type semiconductor, and a light emitting layer provided between the first layer and the second layer, and
      the third layer formed on the first layer;
    forming an insulating member in a part exposed from the support body of the semiconductor layer chips;
    separating the support body from the semiconductor layer chips; and forming an insulating film on a periphery of the semiconductor layer and on a periphery of a part of the third layer exposed from the insulating member after the separating the support body from the semiconductor layer chips.

16. The method according to claim 15, further comprising:

forming an n-side electrode being in contact with the first layer and overlapping the semiconductor layer before the embedding the semiconductor layer into the support body;

forming a p-side electrode being in contact with the second layer and overlapping the semiconductor layer before the embedding the semiconductor layer into the support body;

forming an n-side metal portion being in contact with the n-side electrode and overlapping each of the semiconductor layer and the insulating member after the separating the support body from semiconductor layer chips; and forming a p-side metal portion being in contact with the p-side electrode and overlapping each of the semiconductor layer and the insulating member after the separating the support body from semiconductor layer chips.

17. The method according to claim 16, further comprising:

embedding the n-side electrode and the p-side electrode into the support body.

18. The method according to claim 16, wherein the forming the n-side metal portion includes forming an n-side external connection electrode overlapping the insulating member, and the forming the p-side metal portion includes forming a p-side external connection electrode overlapping the insulating member.

* * * * *